(12) United States Patent
Shioga et al.

(10) Patent No.: US 10,420,253 B2
(45) Date of Patent: Sep. 17, 2019

(54) LOOP HEAT PIPE, MANUFACTURING METHOD THEREOF, AND ELECTRONIC DEVICE

(71) Applicant: FUJITSU LIMITED, Kawasaki-shi, Kanagawa (JP)

(72) Inventors: Takeshi Shioga, Atsugi (JP); Tomoyuki Abe, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/180,648

(22) Filed: Nov. 5, 2018

(65) Prior Publication Data

US 2019/0075682 A1    Mar. 7, 2019

Related U.S. Application Data

(63) Continuation of application No. PCT/JP2016/063762, filed on May 9, 2016.

(51) Int. Cl.
*H05K 7/20* (2006.01)
*F28D 15/02* (2006.01)
(Continued)

(52) U.S. Cl.
CPC ......... *H05K 7/20336* (2013.01); *F28D 15/02* (2013.01); *F28D 15/04* (2013.01);
(Continued)

(58) Field of Classification Search
CPC ............ H05K 7/20309; H05K 7/20336; F28D 15/046
(Continued)

(56) References Cited

U.S. PATENT DOCUMENTS 8,256,501 B2 * 9/2012 Nagai ................ F28D 15/0233
165/104.21
2003/0159809 A1    8/2003 Valenzuela
(Continued)

FOREIGN PATENT DOCUMENTS

CN    202329315    7/2012
JP    2001-336889    12/2001
(Continued)

OTHER PUBLICATIONS

International Search Report and Written Opinion of the International Searching Authority, mailed in connection with PCT/JP2016/063762 dated Jul. 26, 2016 (11 pages), with partial English translation.

*Primary Examiner* — Mukundbhai G Patel
(74) *Attorney, Agent, or Firm* — Fujitsu Patent Center

(57) ABSTRACT

A loop heat-pipe includes an evaporator; a condenser; a first line which connects the evaporator to the condenser and in which working fluid of vapor phase flows; and a second line which connects the condenser to the evaporator and in which working fluid of liquid phase flows, wherein each of the evaporator, the condenser, the first line, and the second line is bonded to a first and second plate, the first plate includes in a region for the evaporator: first protrusions that extend in a length direction, and second protrusions that extend in a width direction, which intersects with the length direction; the second plate includes in a region for the evaporator: either or both of third protrusions extending in the length direction and fourth protrusions extending in the width direction, and recesses partitioned by either or both of the third protrusions and the fourth protrusions.

19 Claims, 18 Drawing Sheets

(51) Int. Cl.
*F28D 15/04* (2006.01)
*H01L 23/427* (2006.01)
*H01L 23/373* (2006.01)

(52) U.S. Cl.
CPC ....... *H01L 23/427* (2013.01); *H05K 7/20309* (2013.01); *H05K 7/20318* (2013.01); *H05K 7/20327* (2013.01); *H01L 23/3736* (2013.01)

(58) Field of Classification Search
USPC .................................................. 361/679.52
See application file for complete search history.

(56) References Cited

U.S. PATENT DOCUMENTS

| | | | |
|---|---|---|---|
| 2005/0051304 A1 | 3/2005 | Makino et al. | |
| 2007/0056711 A1 | 3/2007 | Ohsawa | |
| 2009/0250196 A1* | 10/2009 | Batty | B22F 3/1055 165/104.26 |
| 2012/0106084 A1 | 5/2012 | Mizuta et al. | |
| 2013/0032312 A1* | 2/2013 | Wang | F28D 15/046 165/104.26 |
| 2013/0312939 A1 | 11/2013 | Uchida et al. | |
| 2014/0138056 A1* | 5/2014 | Horng | F28F 3/048 165/104.21 |
| 2015/0077929 A1 | 3/2015 | Honmura et al. | |
| 2016/0209122 A1* | 7/2016 | Wang | F28D 15/0233 |

FOREIGN PATENT DOCUMENTS

| | | |
|---|---|---|
| JP | 2004-190976 | 7/2004 |
| JP | 2005-518518 | 6/2005 |
| JP | 2007-315745 | 12/2007 |
| JP | 2009-236362 | 10/2009 |
| JP | 2013-257129 | 12/2013 |
| JP | 2015-059693 | 3/2015 |
| JP | 2015-183880 | 10/2015 |
| WO | 2001/063195 | 8/2001 |
| WO | 2016/051569 | 4/2016 |

* cited by examiner

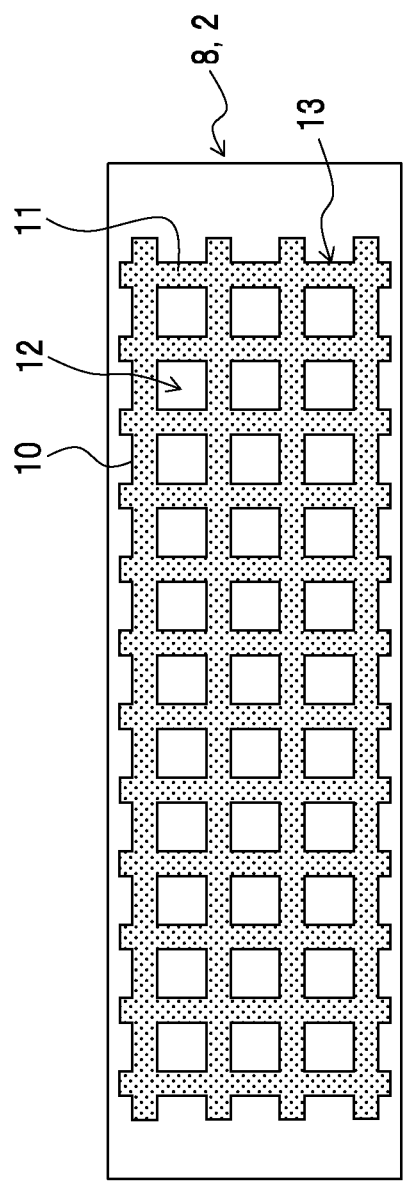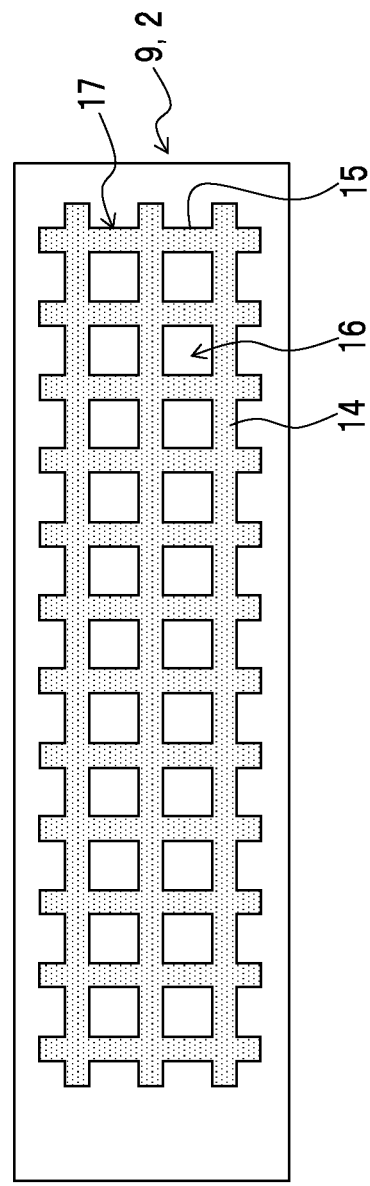

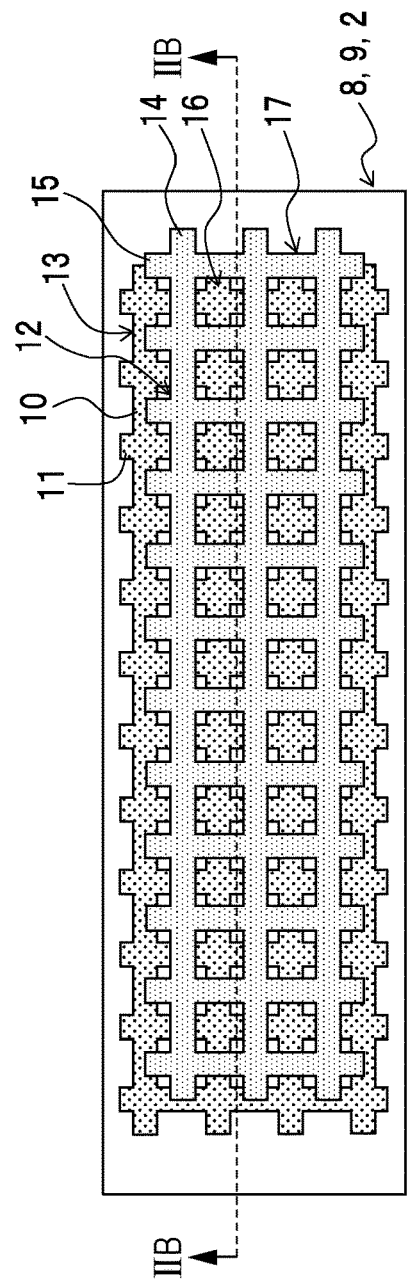
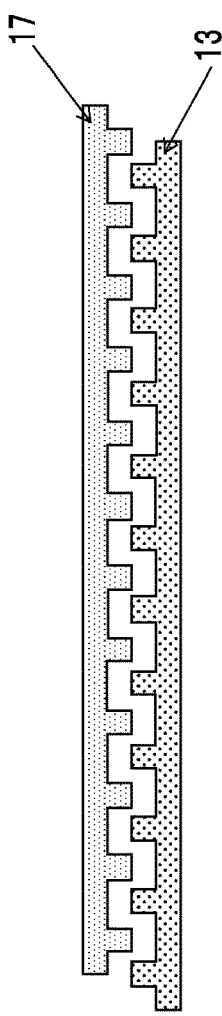
FIG. 2A
FIG. 2B

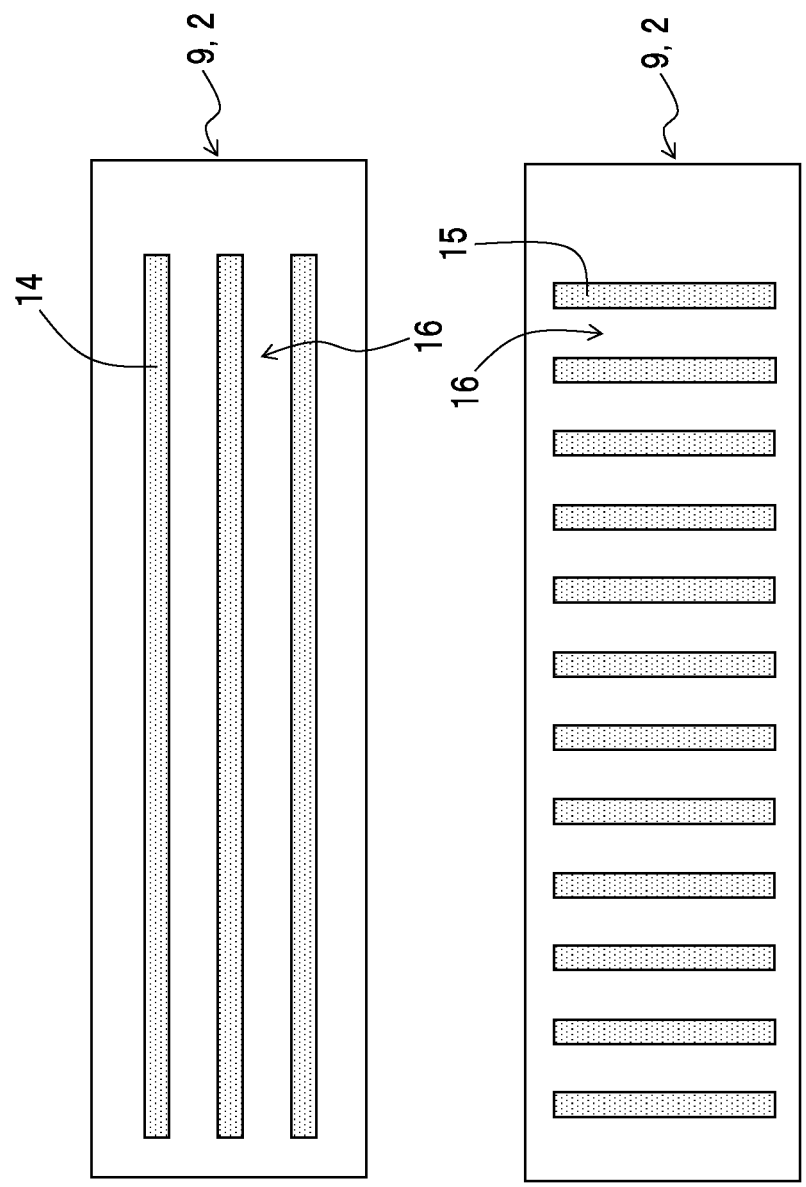

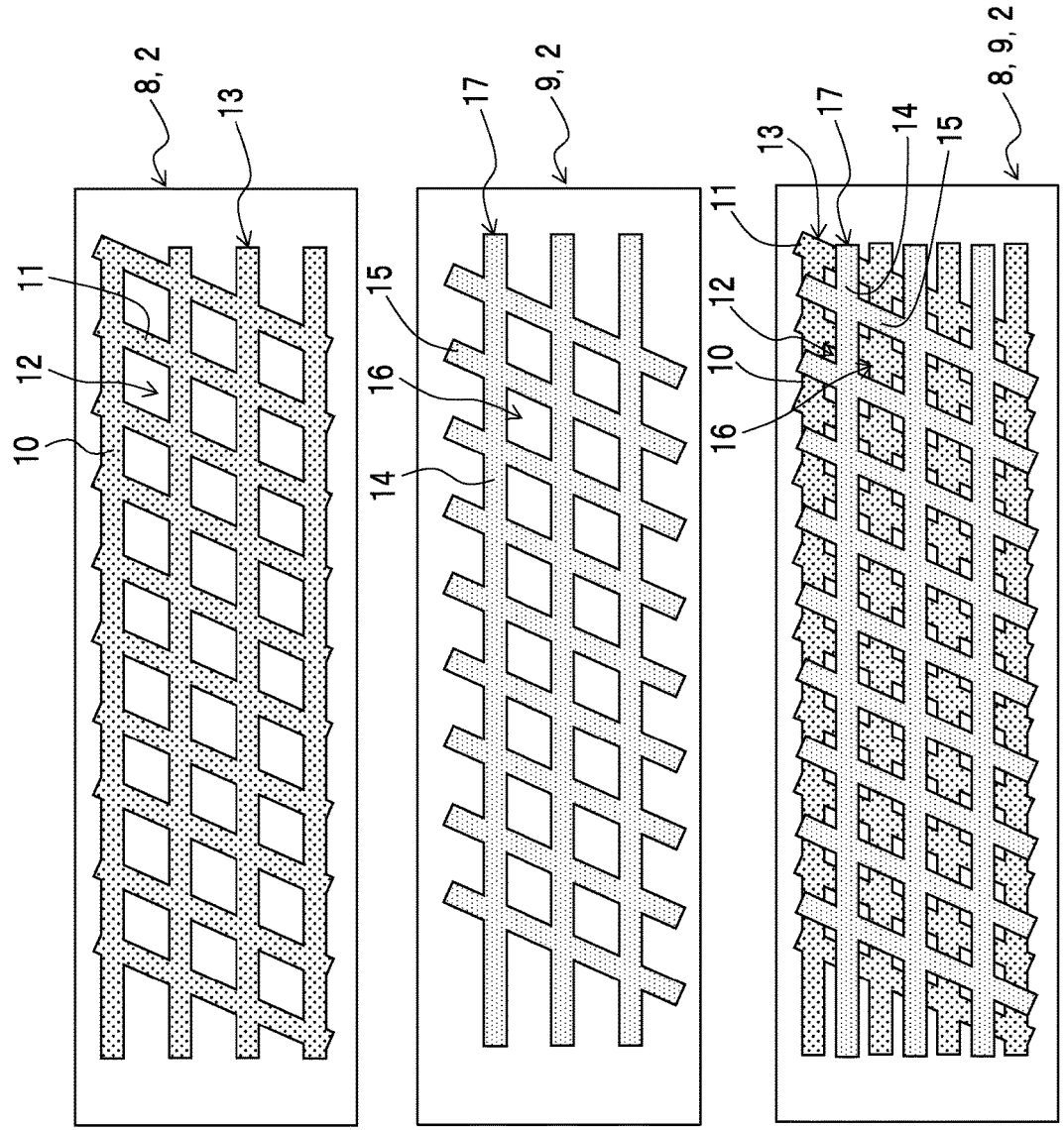

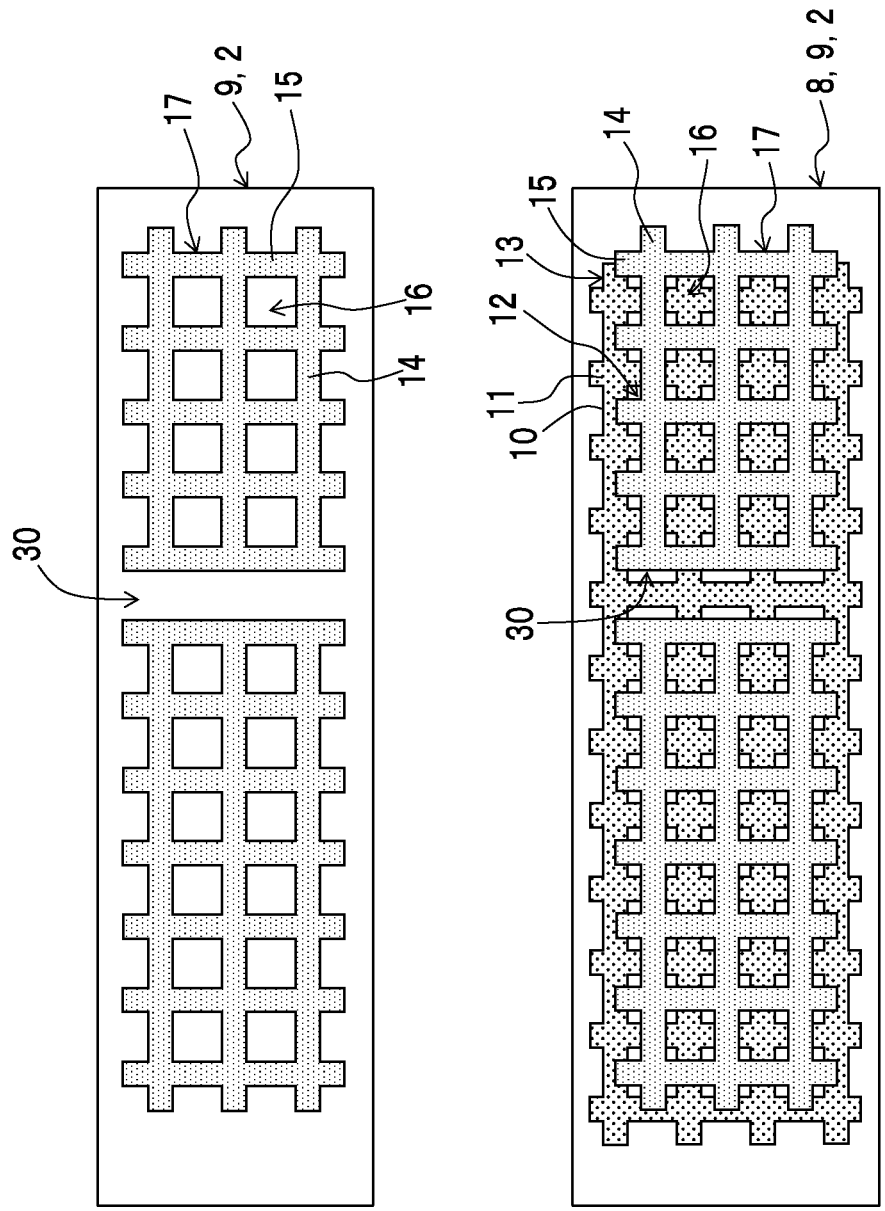

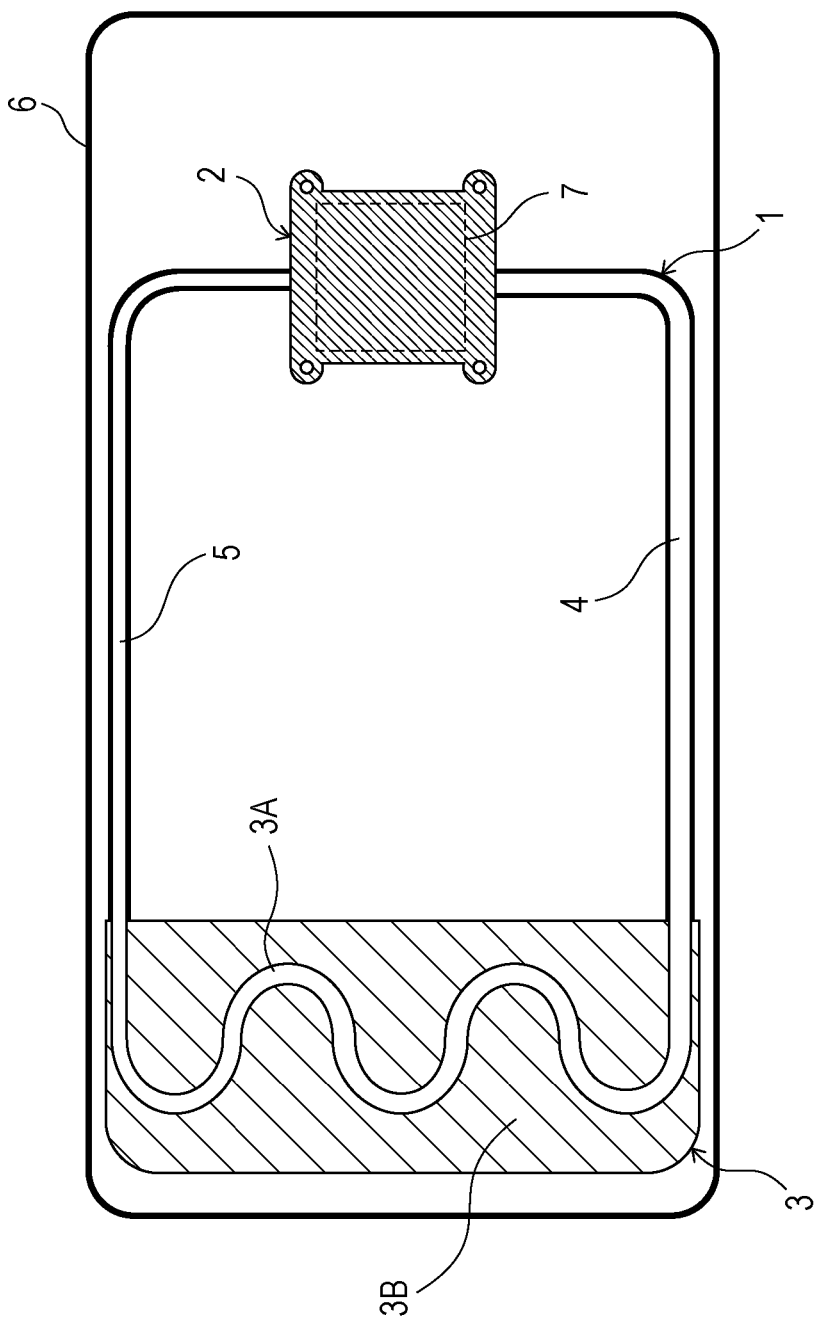

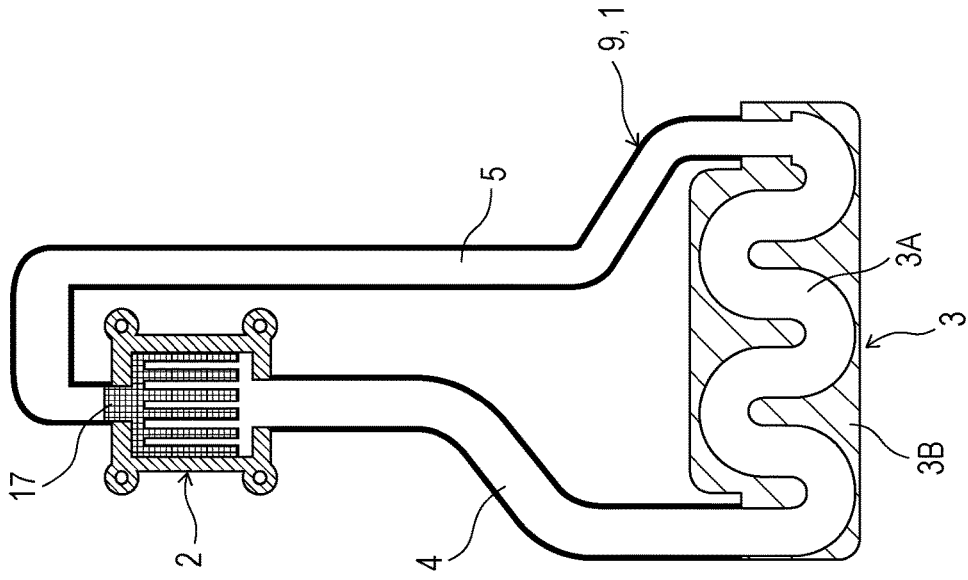
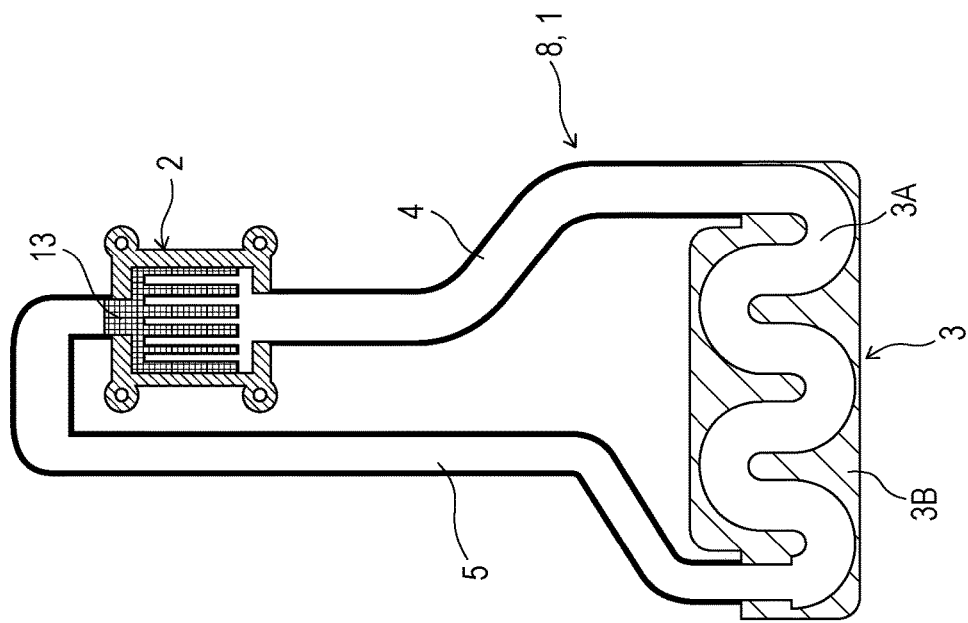

LOOP HEAT PIPE, MANUFACTURING METHOD THEREOF, AND ELECTRONIC DEVICE

CROSS-REFERENCE TO RELATED APPLICATION

This application is a continuation application of International Application PCT/JP2016/063762 filed on May 9, 2016 and designated the U.S., the entire contents of which are incorporated herein by reference.

FIELD

The embodiment discussed herein is related to a loop heat pipe, a manufacturing method thereof, and an electronic device.

BACKGROUND

Heat generating components in small and thin electronic devices for mobile use (mobile devices), such as smart phones and tablets, for example, are cooled using thermally-conducting sheets, including metallic plates and thermal diffusion sheets, for example. Examples of such metallic plates are thin plates of copper, aluminum, magnesium alloy, and a laminate thereof, for example. The thermal conducting performance thereof depends on the thermal conductivity of the material. Examples of thermal diffusion sheets are graphite sheets, which have a thermal conductivity of about 500 to 1500 W/mK. Heat transfer is not performed sufficiently with such a level of thermal conductivity when the heat generating components generates a large amount of heat.

For efficient transfer and diffusion of a larger amount of heat, use of heat pipes could be effective. Heat pipes are heat transfer devices which use latent heat of vaporization of a working fluid, instead of thermal conduction of the material. For example, a heat pipe with a diameter of about 3 to 4 mm is equivalent to a thermally-conducting sheet with a thermal conductivity of about 1500 to 2500 W/mK, that is greater than that of thermal conducting sheets. For more efficient heat transfer, pipes as the heat transfer pipe increase in diameter. This causes a problem in mounting such a heat pipe on a device, and heat pipes are not increasingly applied to mobile devices.

In such a case, heat pipes may be flattened. However, flattening heat pipes will block working fluid from flowing smoothly in the pipe, thus reducing the heat transfer ability. On the other hand, in a loop heat pipe, the channel of working fluid of vapor phase and the channel of the working fluid of liquid phase are independent of each other, and the working fluid flows in one direction. The resistance to flow of the working fluid is small in the loop heat pipe, enabling efficient heat transfer compared with heat pipes in which the working fluid of liquid phase and the working fluid of vapor phase reciprocate within the pipe.

Such a loop heat pipe is considered to be suitable in mobile devices.

Related techniques are disclosed in, for example, Japanese Laid-open Patent Publication Nos. 2009-236362 and 2004-190976.

SUMMARY

According to an aspect of the embodiments, a loop heat pipe comprising: an evaporator; a condenser; a first line which connects the evaporator to the condenser and in which working fluid of vapor phase flows; and a second line which connects the condenser to the evaporator and in which working fluid of liquid phase flows, wherein the evaporator, the condenser, the first line, and the second line constitute a structure by bonding a first plate and a second plate, the first plate includes in a region for the evaporator: a plurality of first protrusions that extend in a length direction of the evaporator from an end side connected to the second line toward an end side connected to the first line; a plurality of second protrusions that extend in a width direction of the evaporator, which intersects with the length direction; and a plurality of first recesses which are partitioned by the plurality of first protrusions and the plurality of second protrusions, the second plate includes in a region for the evaporator: either or both of a plurality of third protrusions extending in the length direction and a plurality of fourth protrusions extending in the width direction; and a plurality of second recesses partitioned by either or both of the plurality of third protrusions and the plurality of fourth protrusions, the first plate and the second plate are bonded to each other so that in the region, the plurality of first recesses face either or both of the plurality of third protrusions and the plurality of fourth protrusions while each of the plurality of first recesses communicates with the second recesses located on both sides of a corresponding third or fourth protrusion or any combination thereof.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are schematic plan views illustrating a configuration example of a grid-pattern structure provided for an evaporator of a loop heat pipe according to an embodiment, FIG. 1A illustrating a grid pattern provided for a first plate member, FIG. 1B illustrating a grid pattern provided for a second plate member;

FIGS. 2A and 2B are schematic plan views illustrating a configuration example of the grid-pattern structure provided for the evaporator of the loop heat pipe according to the embodiment, FIG. 2A being a plan view illustrating the first and second plate members laid on each other, FIG. 2B being a cross-sectional view taken along a line IIB-IIB in FIG. 2A;

FIGS. 3A and 3B are schematic plan views illustrating a modification of the grid-pattern structure provided for the evaporator of the loop heat pipe according to the embodiment, illustrating the grid pattern provided for the second plate member;

FIGS. 4A to 4C are schematic plan views illustrating a modification of the grid-pattern structure provided for the evaporator of the loop heat pipe according to the embodiment, FIG. 4A illustrating a grid pattern provided for the first plate member, FIG. 4B illustrating a grid pattern provided for the second plate member, FIG. 4C illustrating the first and second plate members laid on each other;

FIGS. 6A and 6B are schematic plan views illustrating a modification of the grid-pattern structure provided for the evaporator of the loop heat pipe according to the embodiment, FIG. 6A illustrating a grid pattern provided for the second plate member, FIG. 6B illustrating the first and second plate members laid on each other;

FIG. 7 is a schematic diagram illustrating a configuration of an electronic device including the loop heat pipe according to the embodiment;

FIGS. 16A and 16B are schematic diagrams for explaining a specific configuration example of the loop heat pipe according to the embodiment and a manufacturing method thereof;

DESCRIPTION OF EMBODIMENTS

Hereinafter, a description is given of a loop heat pipe according to an embodiment of the disclosure, a method of manufacturing the same, and an electronic device with reference to the drawings. First, the loop heat pipe according to the embodiment is described with reference to FIGS. 1A to 19. The loop heat pipe according to the embodiment is a thin loop heat pipe which is provided for a small and thin electronic device for mobile use, such as a smart phone or a tablet terminal, for example. The loop heat pipe transfers heat generated by a heat generating component (an LSI chip, for example) provided for the electronic device to cool the heat generating components as a heat source.

The small and thin electronic device for mobile use is also referred to as a mobile device. The heat generating components is also referred to as an electronic component or a heat-generating element. As illustrated in FIG. 7, the loop heat pipe of the embodiment includes: an evaporator 2 in which working fluid of liquid phase evaporates; a condenser 3 in which the working fluid of vapor phase condenses; a vapor line 4 which connects the evaporator 2 to the condenser 3 and in which the working fluid of vapor phase flows; and a liquid line 5 which connects the condenser 3 to the evaporator 2 and in which the working fluid of liquid phase flows.

Figure 8:
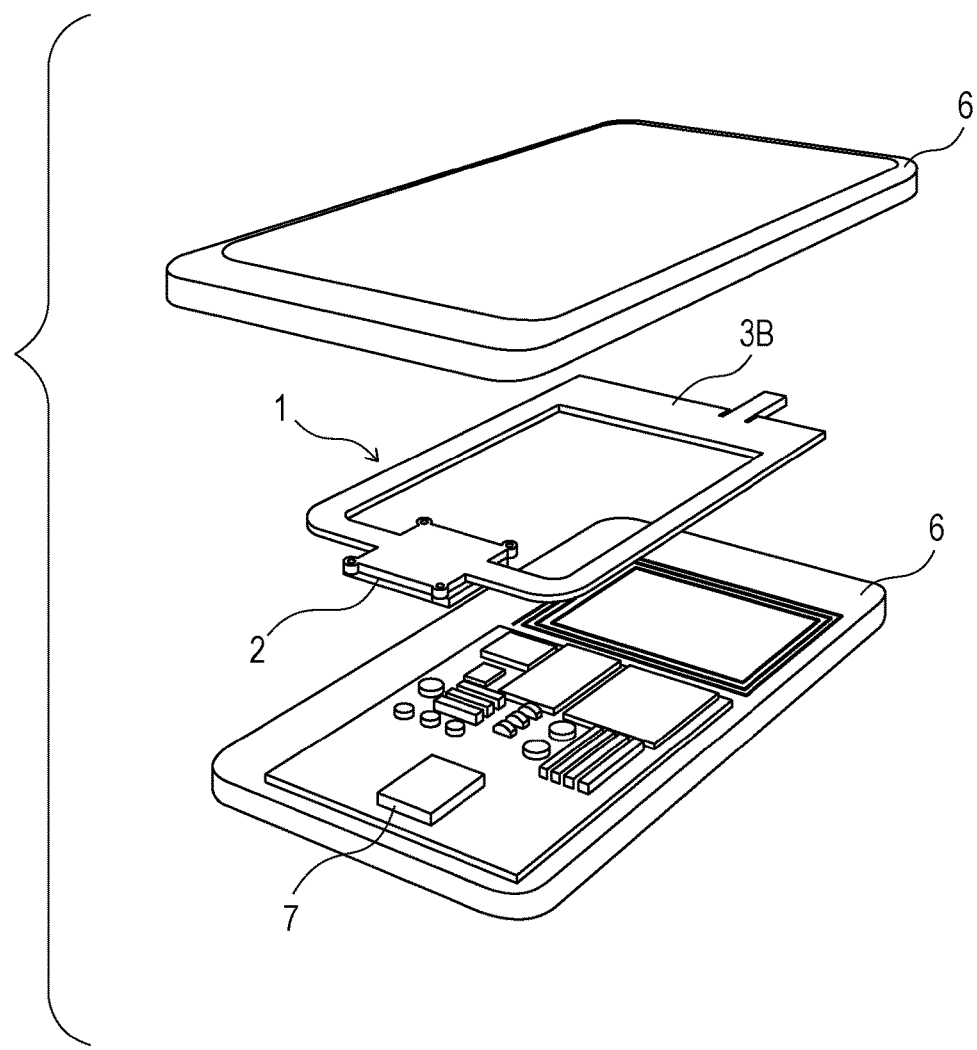
FIG. 8 is a schematic diagram illustrating the configuration of an electronic device including the loop heat pipe according to the embodiment.

Herein, the condenser 3 includes a condensation line 3A and a thermal diffusion plate (heat dissipation plate) 3B. As illustrated in FIGS. 7 and 8, the thus-configured loop heat pipe 1 is accommodated in a mobile device 6. The evaporator 2 is thermally connected to a heat generating component 7 of the mobile device 6.

The working fluid is water, ethanol, acetone, methanol, or chlorofluorocarbons, for example. Herein, the evaporator 2 includes a liquid inlet and a vapor outlet, and the condenser 3 includes a vapor inlet and a liquid outlet. The vapor outlet of the evaporator 2 and the vapor inlet of the condenser 3 are connected through the vapor line 4. The liquid outlet of the condenser 3 and the liquid inlet of the evaporator 2 are connected through the liquid line 5.

The evaporator 2, vapor line 4, condenser 3, and liquid line 5 are joined in a loop. The working fluid encapsulated in these components flows in one direction. The working fluid changes from liquid phase to vapor phase with heat supplied from the heat generating component 7 to the evaporator 2 and moves to the condenser 3 together with heat through the vapor line 4. The working fluid is subjected to heat dissipation in the condenser 3 to change from vapor phase to liquid phase and returns to the evaporator 2 through the liquid line 5.

The flowing resistance of the working fluid is smaller than that in a heat pipe in which liquid-phase working fluid and vapor-phase working fluid reciprocate. The loop heat pipe thus allows for efficient heat transfer. In the embodiment, the evaporator 2, condenser 3, vapor line 4, and liquid line 5 constitute a structure including a first plate member 8 and a second plate member 9 bonded to each other (see FIGS. 16A and 16B). The evaporator 2, condenser 3, vapor line 4, and liquid line 5 include the upper and lower two plate members 8 and 9.

Herein, as illustrated in FIG. 1A, the first plate member 8 includes a plurality of first protrusions 10, a plurality of second protrusions 11, and plural first recesses 12 in a region constituting the evaporator 2. The plural first protrusions 10 extend in a length direction from the end connected to the liquid line 5 toward the end connected to the vapor line 4. The plural second protrusions 11 extend in the width direction, which intersect with the length direction. The plural first recesses 12 are partitioned by the plurality of first and second protrusions 10 and 11. The plural first recesses 12 have a depth smaller than the plate thickness herein.

The length direction is also referred to as a length direction of the evaporator 2. The width direction is also referred to as a width direction of the evaporator 2. The protrusions are also referred to as protrusion structures or walls. The recesses are also referred to as recess structures. Herein, the first plate member 8 is a metallic plate (metallic thin plate) and specifically, is a copper plate (copper thin plate). The first plate member 8 includes a grid pattern structure (grid structure; grid pattern) 13 in the region constituting the evaporator 2. In the grid pattern structure, the plural first recesses 12, which are formed by processing, such as half etching, for example, so as to have a depth smaller than the plate thickness, are arranged like dots. The plural first recesses 12 are partitioned by the first and second protrusions 10 and 11.

Herein, the plural first recesses 12 are half-etched portions and each include a recess structure including a space surrounded by the bottom and side surfaces. The plural first recesses 12 are arranged at regular intervals like dots. In the embodiment, as described later, the evaporator 2 includes a comb-like vapor channel 18 and a comb section 19, which generates capillary force (see FIG. 9). The comb section 19 is provided with the grid pattern structure 13.

Herein, the first recesses 12 extend from the surface to the middle in the plate thickness direction without penetrating the first plate member 8. Each first recess 12 constitutes a space with only the top opened. As illustrated in FIG. 1B, the second plate member 9 includes in the region constituting the evaporator 2: plural third protrusions 14 extending in the length direction; plural fourth protrusions 15 extending in the width direction; and plural second recesses 16 partitioned by the third and fourth protrusions 14 and 15. The plural second recesses 16 have a depth smaller than the plate thickness.

Herein, the second plate member 9 is a metallic plate (metallic thin plate) and specifically, is a copper plate (copper thin plate). The second plate member 9 includes a grid pattern structure (grid structure; grid pattern) 17 in the region constituting the evaporator 2. In the grid pattern structure 17, the plural second recesses 16, which are formed by processing, such as half etching, for example, to have a depth smaller than the plate thickness, are arranged. The plural second recesses 16 are partitioned by the third and fourth protrusions 14 and 15.

Herein, the plurality of second recesses 16 are half-etched portions and each include a recess structure including a space surrounded by the bottom and side surfaces. The plurality of second recesses 16 are arranged at regular intervals like dots. In the embodiment, as described later, the evaporator 2 includes the comb-like vapor channel 18 and the comb section 19, which generates capillary force (see FIG. 9). The comb section 19 is provided with the grid pattern structure 17.

The second recesses 16 extend from the surface to the middle in the plate thickness direction without penetrating the second plate member 9. Each second recess 16 constitutes a space with only the top opened. The first and second plate members 8 and 9 are bonded as illustrated in FIGS. 2A and 2B so that in the region constituting the evaporator 2, the first recesses 12 face the third and fourth protrusions 14 and 15 and each communicate with the second recesses 16 on both sides of the corresponding third protrusion 14 and on both sides of the corresponding fourth protrusion 15.

The first and second plate members 8 and 9 are bonded so that in the region constituting the evaporator 2, the second recesses 16 face the first and second protrusions 10 and 11 and each communicate with the first recesses 12 on both sides of the corresponding first protrusion 10 and on both sides of the corresponding second protrusion 11. In such a manner, the first and second plate members 8 and 9 are laid and bonded on each other with the first and second recesses 12 and 16 inside so that the positions (opening positions) of the first and second recesses 12 and 16 are shifted from each other, that is, the first and second recesses 12 and 16 are placed at different positions from each other.

When the first and second plate members 8 and 9 are bonded in the aforementioned manner, the first and second recesses 12 and 16, which have only the top opened, communicate to each other. The communicating portions (spaces) serve as channels and function in a similar manner to a wick provided within the evaporator of a general loop heat pipe to generate capillary force. The working fluid of liquid phase penetrates the evaporator 2 and changes to vapor phase. The third and fourth protrusions 14 and 15 facing the first recesses 12 and the first and second protrusions 10 and 11 facing the second recesses 16 reduce the sectional areas of the channels allowing the first and second recesses 12 and 16 to communicate with each other, thus increasing the capillary force generated in the evaporator 2.

It is therefore particularly preferable that the first and second plate members 8 and 9 are bonded so that each intersection of the third and fourth protrusions 14 and 15 of the second plate member 9 is located in the center of the corresponding first recess 12 of the first plate member 8 while each intersection of the first and second protrusions 10 and 11 of the first plate member 8 is located in the center of the second recesses 16 of the second plate member 9. In such a configuration, the sectional areas of the channels allowing the first and second recesses 12 and 16 to communicate with each other are reduced evenly, therefore the capillary force generated in the evaporator 2 increases.

The number, intervals, shape, and the like of the first, second, third, and fourth protrusions 10, 11, 14, and 15 are not limited to those illustrated herein. The number, intervals, shape, opening area, and the like of the first and second recesses 12 and 16 are also not limited to those illustrated herein. The loop heat pipe of the disclosure is not limited to the aforementioned configuration. As illustrated in FIGS. 3A and 3B, the second plate member 9 may be configured to include in the region constituting the evaporator 2, either or both of the plural third protrusions 14 extending in the length direction and the plural fourth protrusions 15 extending in the width direction and the plural second recesses 16 partitioned by either or both of the third and fourth protrusions 14 and 15.

In this case, the first and second plate members 8 and 9 are bonded so that in the region constituting the evaporator 2, the first recesses 12 face either or both of the third and fourth protrusions 14 and 15 and each communicate with the second recesses 16 on both sides of the corresponding third and fourth protrusions 14 and 15. In the embodiment, as illustrated in FIG. 1A, the plural first protrusions 10 extend parallel to each other. The plural second protrusions 11 extend parallel to each other and are orthogonal to the plural first protrusions 10. As illustrated in FIGS. 1B and 2A, the plural third protrusions 14 extend parallel to each other and parallel to the first protrusions 10. The plural fourth protrusions 15 extend parallel to each other and parallel to the second protrusions 11. In this case, the plural fourth protrusions 15 are therefore orthogonal to the third protrusions 14.

As described above, the second plate member 9 may be provided with either the third or fourth protrusions 14, 15 in some cases (see FIGS. 3A and 3B). When the second plate member 9 is provided with only the plural third protrusions 14, the plural third protrusions 14 extend parallel to each other and parallel to the first protrusions 10. When the second plate member 9 is provided with only the plural fourth protrusions 15, the plural fourth protrusions 15 extend parallel to each other and parallel to the second protrusions 11.

The first and second plate members 8 and 9 of the disclosure are not limited to the aforementioned configurations. As illustrated in FIGS. 4A to 4C, for example, the first protrusions 10 extend parallel to each other; the second protrusions 11 extend parallel to each other and diagonally intersect with the first protrusions 10 (at a certain angle). The plural third protrusions 14 extend parallel to each other and parallel to the first protrusions 10, and the plural fourth protrusions 15 may extend parallel to each other and parallel to the second protrusions 11. In this case, the fourth protrusions 15 diagonally intersect with the third protrusions 14.

As described above, the second plate member 9 is provided with either the third or fourth protrusions 14, 15 in some cases (see FIGS. 3A and 3B). When the second plate member 9 is provided with only the third protrusions 14, the third protrusions 14 extend parallel to each other and parallel to the first protrusions 10. When the second plate member 9 is provided with only the fourth protrusions 15, the fourth protrusions 15 extend parallel to each other and parallel to the second protrusions 11.

In the embodiment, as illustrated in FIGS. 1A and 1B and FIGS. 4A and 4B, the intervals of the first protrusions 10, plural second protrusions 11, plural third protrusions 14, and plural fourth protrusions 15 are the same. Herein, the intervals of the first protrusions 10, plural second protrusions 11, plural third protrusions 14, and plural fourth protrusions 15 correspond to the smallest width of fine grooves that may be formed by etching (fine grooves having a size that may maximize the generated capillary force).

As described above, the second plate member 9 is provided with either the third or fourth protrusions 14, 15 in some cases (see FIGS. 3A and 3B). In this case, the intervals of the first protrusions 10, plural second protrusions 11, and either or both of the plural third protrusions 14 and plural fourth protrusions 15 are the same. In this embodiment, the first and second recesses 12 and 16 have the same size (the same opening area).

The first and second recesses 12 and 16 are of the same size and are arranged at regular intervals in this embodiment. In the process of bonding the first and second plate member 8 and 9 shifted from each other, therefore, the positions of the first and second recesses 12 and 16 are easily adjusted, ensuring the channels allowing the first and second recesses 12 and 16 to communicate with each other. In the embodiment, in the first plate member 8, the first and second protrusions 10 and 11, which constitute the side surfaces of the first recesses 12, and the bottom surfaces of the first recesses 12 are made of the same material. In the second plate member 9, the third and fourth protrusions 14 and 15, which constitute the side surfaces of the second recesses 16, and the bottom surfaces of the second recesses 16 are made of the same material.

As described above, the evaporator 2 is provided with either the third or fourth protrusions 14, 15 in some cases (see FIGS. 3A and 3B). In this case, in the second plate member 9, either or both of the third and fourth protrusions 14 and 15, which constitute the side surfaces of the second recesses 16, and the bottom surfaces of the second recesses 16 are made of the same material. Since the first and second recesses 12 and 16 are formed by half etching as described above, the side surfaces thereof and the bottom surfaces are therefore made of the same material. The first and second recesses 12 and 16 are not limited to such a configuration.

For example, in the first plate member 8, the first and second protrusions 10 and 11, which constitute the side surfaces of the first recesses 12, may be made of a material different from that of the bottom surfaces of the first recesses 12. Similarly, in the second plate member 9, the third and fourth protrusions 14 and 15, which constitute the side surfaces of the second recesses 16, may be made of a material different from that of the bottom surfaces of the second recesses 16. For example, the first and second plate members 8 and 9 may include a plate member and a wire mesh member attached thereon.

Figure 5A:
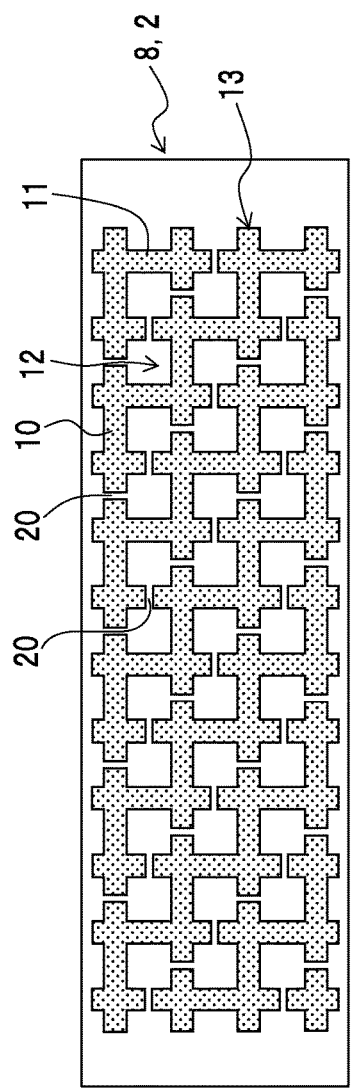
FIGS. 5A to 5C are schematic plan views illustrating a modification of the grid-pattern structure provided for the evaporator of the loop heat pipe according to the embodiment, FIG. 5A illustrating a grid pattern provided for the first plate member, FIG. 5B illustrating a grid pattern provided for the second plate member, FIG. 5C illustrating the first and second plate members laid on each other.
Figure 5B:
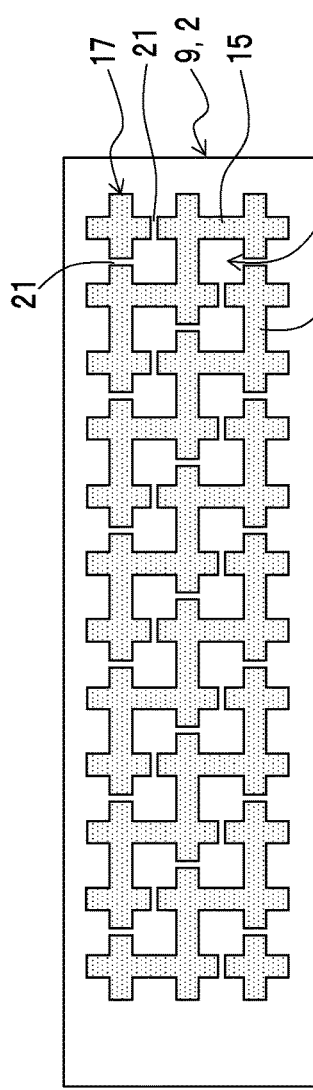
Figure 5C:
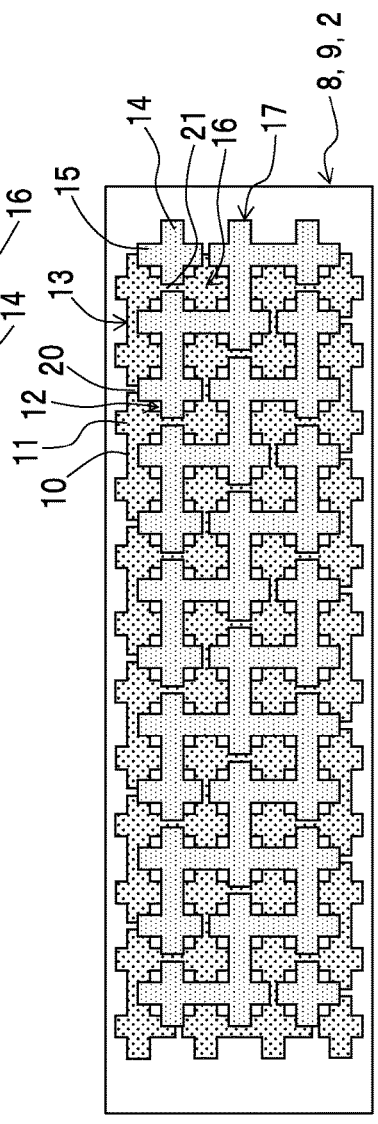

The first and second plate members 8 and 9 are not limited to the aforementioned configurations. As illustrated in FIGS. 5A to 5C, for example, the first and second protrusions 10 and 11, which constitute the side surfaces of the first recesses 12, may be provided with first communicating grooves 20. The first communicating grooves 20 allow the first recesses 12 adjacent to each other to communicate with each other. Herein, at least one of the first and second protrusions 10 and 11 constituting the side surface of each first recess 12 is provided with one of the first communicating grooves 20. For example, when the side surface of each first recess 12 is defined by four side protrusions, at least one of the side protrusions is provided with one of the first communicating grooves 20.

The first communicating grooves 20 may be formed by partially removing the first and second protrusions 10 and 11 constituting the side surfaces of the first recesses 12. When the second plate member 9 includes the plural third protrusions 14, plural fourth protrusions 15, and the plural second recesses 16, which are partitioned by the third and fourth protrusions 14 and 15, the third and fourth protrusions 14 and 15, which constitute the side surfaces of the second recesses 16, may be provided with second communicating grooves 21 that allow the adjacent second recesses 16 to communicate with each other.

Herein, at least one of the third and fourth protrusions 14 and 15 constituting the side surface of each second recess 16 is provided with one of the second communicating grooves 21. For example, when the side surface of each second recess 16 is defined by four side protrusions, at least one of the side protrusions is provided with one of the second communicating grooves 21. The second communicating grooves 21 are formed by partially removing the third and fourth protrusions 14 and 15 constituting the side surfaces of the second recesses 16.

In this case, the grid patterns 13 and 17 provided for comb sections 19A, which are located between the plural branch vapor channels 18A of the comb-like vapor channel 18 of the evaporator 2, include the first and second communicating grooves 20 and 21 that allow two adjacent vapor channels to communicate with each other. By providing the first and second communicating grooves 20 and 21 in such a manner, adjacent vapor channels communicate with each other (see FIG. 9), thus reducing the difference in pressure between the vapor channels and reducing the pressure distribution in the evaporator 2 due to vapor generation. The working fluid of vapor phase generated due to heat from the heat generating component 7 as a heat source is discharged to the vapor line 4 evenly. It is therefore possible to shorten the start-up time of the loop heat pipe 1.

Figure 9:
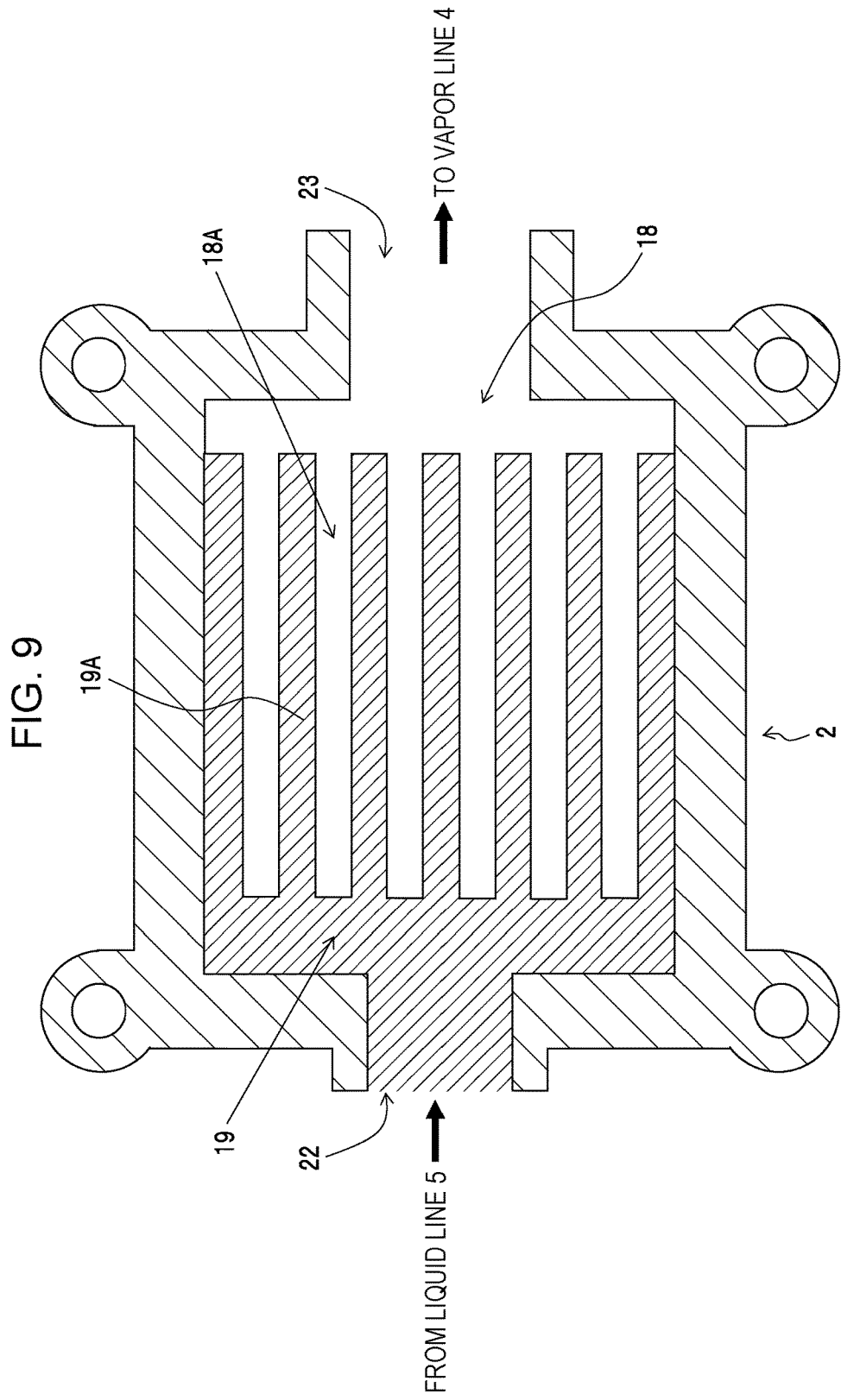
FIG. 9 is a schematic diagram for explaining an internal configuration of the evaporator of the loop heat pipe according to the embodiment.

In the embodiment, as illustrated in FIG. 9, the evaporator 2 includes a liquid inlet 22 connected to the liquid line 5; a vapor outlet 23 connected to the vapor line 4, the comb section 19 in which the working fluid of liquid phase penetrates and becomes vapor phase; and the comb-like vapor channel 18 in which the working fluid of vapor phase flows. Herein, the comb section 19 extends from the end connected to the liquid line 5 and divides to form plural branch sections (branch sections; rib-shaped sections) 19A. The comb section 19 is a section that is connected to the liquid line 5 and extends inward from the liquid inlet 22 in a comb-like manner.

The comb-like vapor channel 18 faces the comb section 19. The comb-like vapor channel 18 extends from the end connected to the vapor line 4 and divides to form plural branch vapor channels 18A. The comb-like vapor channel 18 is a vapor channel that is connected to the vapor line 4 and extends inward from the vapor outlet 23 in a comb-like manner. The comb-like vapor channel 18 is a channel to discharge the working fluid of vapor phase flowing within the evaporator 2, to the vapor line 4 and is also referred to as a vapor discharge channel.

The plural branch vapor channels 18A of the comb-like vapor channel 18 are provided between the plural branch sections 19A of the comb section 19. The plural branch sections 19A of the comb section 19 and the plural branch vapor channels 18A of the comb-like vapor channel 18 are arranged alternately in the in-plane direction, so that the evaporator 2 becomes thinner.

The first plate member 8 includes the first protrusions 10, second protrusions 11, and first recesses 12 in the region constituting the comb section 19 (see FIGS. 1A and 2A). The second plate member 9 includes the third protrusions 14, fourth protrusions 15, and second recesses 16 in the region constituting the comb section 19 (see FIGS. 1B and 2A). As described above, the second plate member 9 includes either the third or fourth protrusions 14, 15 in some cases (see FIGS. 3A and 3B). In this case, the second plate member 9 includes either or both of the third and fourth protrusions 14 and 15 and the second recesses 16 in the region constituting the comb section 19.

The first protrusions 10, which are provided for the first plate member 8, extend parallel to the plural branch vapor channels 18A of the comb-like vapor channel 18 (that is, in the direction that the vapor flows). The second protrusions 11, which are provided for the first plate member 8, extend orthogonally to the plural branch vapor channels 18A of the comb-like vapor channel 18. The third protrusions 14, which are provided for the second plate member 9, extend parallel to the plural branch vapor channels 18A of the comb-like vapor channel 18. The fourth protrusions 15, which are provided for the second plate member 9, extend orthogonally to the plural branch vapor channels 18A of the comb-like vapor channel 18.

The second protrusions 11, which are provided for the first plate member 8, may diagonally intersect with the plural branch vapor channels 18A of the comb-like vapor channel 18 (see FIGS. 4A and 4C). The fourth protrusions 15, which are provided for the second plate member 9, may diagonally intersect with the plural branch vapor channels 18A of the comb-like vapor channel 18 (see FIGS. 4B and 4C).

Preferably, the first plate member 8 includes in the region constituting the comb-like vapor channel 18, plural wide grooves which are wider than the intervals of the plural first protrusions 10. The second plate member 9 includes in the region constituting the comb-like vapor channel 18, plural wide grooves wider than the intervals of the plural third protrusions 14. The wide grooves provided for the first and second plate members 8 and 9 constitute the vapor channel 18.

The wide grooves provided for the first and second plate members 8 and 9 are grooves of such a size as to constitute channels in which the working fluid of vapor phase flows to be discharged to the vapor line 4. In the comb-like vapor channel 18, the channel width of each of the plural branch vapor channels 18A is preferably wider than the intervals of the plural first protrusions 10 (or the third protrusions 14). This may reduce pressure loss.

Each of the plural branch sections 19A of the comb section 19 (see FIG. 9) is preferably provided with a third communicating groove 30. The third communicating groove 30 allows adjacent two vapor channels 18A of the plural branch vapor channels 18A of the comb-like vapor channel 18 to communicate with each other. In this case, as illustrated in FIGS. 6A and 6B, the third communicating groove 30 is provided at least one of the first and second plate members 8 and 9. FIGS. 6A and 6B illustrate a case where the third communicating groove 30 is provided for the second plate member 9.

In this case, the third communicating groove 30, which allows two adjacent branch vapor channels to communicate with each other, is provided for the grid pattern 17 (13), which is provided for the comb section 19A sandwiched between the plural branch vapor channels 18A of the comb-like vapor channel 18 of the evaporator 2. By allowing adjacent branch vapor channels 18A (see FIG. 9) to communicate with each other through the third communicating groove 30, the difference in pressure between the plural branch vapor channels 18A is reduced, so that the pressure distribution in the evaporator 2 due to vapor generation is reduced. The working fluid of vapor phase generated due to heat from the heat generating component 7 as a heat source is discharged to the vapor line 4 evenly. It is therefore possible to shorten the start-up time of the loop heat pipe 1.

Figure 10:
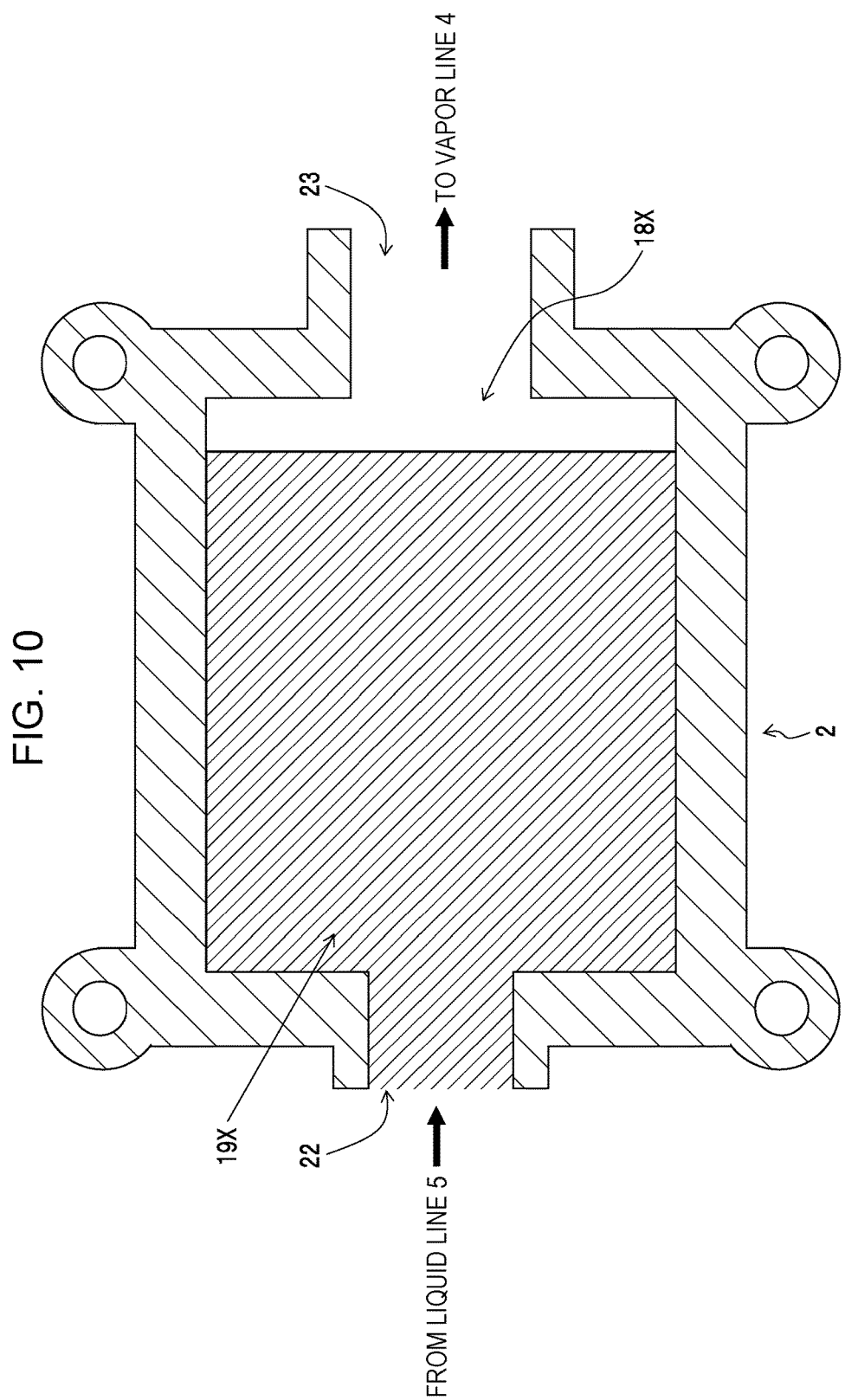
FIG. 10 is a schematic diagram for explaining another internal configuration of the evaporator of the loop heat pipe according to the embodiment.

The number, intervals, and shape of the plural branch sections 19A of the comb section 19 are not limited to those illustrated above. The number, intervals, and shape of the plural branch vapor channels 18A of the comb-like vapor channel 18 are not limited to those illustrated above. The evaporator 2 may be configured not to include the comb section 19 or comb-like vapor channel 18. As illustrated in FIG. 10, for example, the evaporator 2 may include: a section generating capillary force, that is, a section 19X in which the working fluid of liquid phase penetrates and becomes vapor phase; and a vapor channel 18X in which the working fluid in vapor phase flows.

Figure 11:
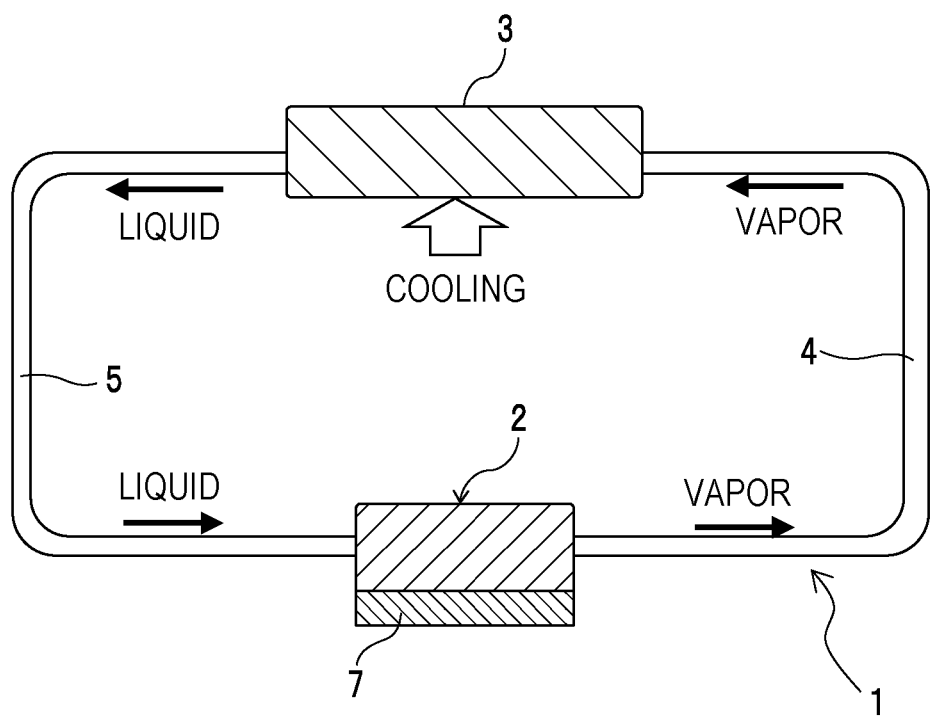
FIG. 11 is a schematic diagram for explaining the configuration and operation of the loop heat pipe.

The loop heat pipe of the embodiment is configured as described above because of the following reasons. As illustrated in FIG. 11, the loop heat pipe 1 includes the evaporator 2, the condenser 3, and the vapor line 4 and liquid line 5, which connect the evaporator 2 and condenser 3. The working fluid is encapsulated within these components at a certain pressure. The working fluid changes from liquid phase to vapor phase due to heat supplied from the externally-provided heat generating component 7 to the evaporator 2 and move with heat to the condenser 3 through the vapor line 4. Due to heat dissipation in the condenser 3, the working fluid changes from vapor phase to liquid phase and returns to the evaporator 2 through the liquid line 5.

The evaporator 2 accommodates a member (not illustrated) called a wick including micropores (pores). When the working fluid penetrates the wick, capillary force is produced in micropores and serves as pumping force to move the fluid. When the evaporator 2 is heated by heat from the heat generating component 7, the working fluid of liquid phase within the wick evaporates in the surface of the wick into vapor phase.

The change of phase in the evaporator 2 uses heat generated by the heat generating component 7. In other words, the heat generating component 7 loses heat. The working fluid of vapor phase generated in the evaporator 2 moves through the vapor line 4 to the condenser 3 and changes to liquid phase in the condenser 3. The working fluid of liquid phase moves through the liquid line 5 to the evaporator 2.

By repeating such circulation of the working fluid, heat generated by the heat generating component 7 is transferred continuously. In the loop heat pipe 1, the working fluid of vapor phase generated by heat form the evaporator 2 passes through the vapor line 4 to the condenser 3. In this situation, the working fluid of liquid phase (working liquid) is ideally located from the liquid line 5 side of the condenser 3 to the evaporator 2 while the working liquid is held in the wick of the evaporator 2.

The capillary force acting in the micropores of the wick prevents vapor from entering to the liquid line 5 from the evaporator 2 (reverse flow). The capillary force generated when the working liquid penetrates into the wick is used as a driving source of the coolant in the loop heat pipe 1. For the fluid to move in the loop heat pipe 1, that is, for the working fluid which receives the latent heat in the evaporator 2 and is liquefied in the condenser 3 to return to the evaporator 2 again, the following condition is requested.

$$\Delta P_{cap} \geq \Delta P_{total} \qquad (1)$$

Herein, $\Delta P_{cap}$ is capillary pressure generated in the evaporator 2, and $\Delta P_{total}$ is the total pressure loss in the channels of the loop heat pipe 1.

The above expression (1) illustrates that increasing the capillary force $\Delta P_{cap}$ in the evaporator 2 as the driving source of the loop heat pipe 1 improves the heat transport capability of the loop heat pipe 1. As illustrated in FIGS. 7 and 8, to apply the thus-configured loop heat pipe 1 to the mobile device 6, the loop heat pipe 1 includes the evaporator 2 which is in contact with the heat generating component 7 as the heat source, the vapor line 4, the condenser 3, which includes the condensation line 3A and heat diffusion plate 3B, and the liquid line 5. The heat of the heat generating component 7 in contact with the evaporator 2 is transferred to a comparatively low temperature region in the mobile device 6 to diffuse the heat of the heat generating component 7.

In the case of applying the loop heat pipe 1 to the mobile device 6, the constituent components of the loop heat pipe 1 are designed to be thinner. If the evaporator 2, vapor line 4, condenser 3, and liquid line 5, as the constituent components of the loop heat pipe 1, are separately manufactured and are connected by welding or the like, for example, it is difficult to implement a thinner loop heat pipe.

The wick accommodated in the evaporator 2 includes a porous body of sintered metal, sintered resin, or ceramics, for example. When the evaporator 2 is made thinner, the wick accommodated in the evaporator 2 is also made thinner. However, when the porous body made of the aforementioned material is made thin, damages and cracks are likely to occur. The loop heat pipe 1 could be thinned in such a manner that the evaporator 2, condenser 3, vapor line 4, and liquid line 5 are manufactured by stacking plural metallic plates on the top of each other and diffusion-bonding the same.

Figure 12:
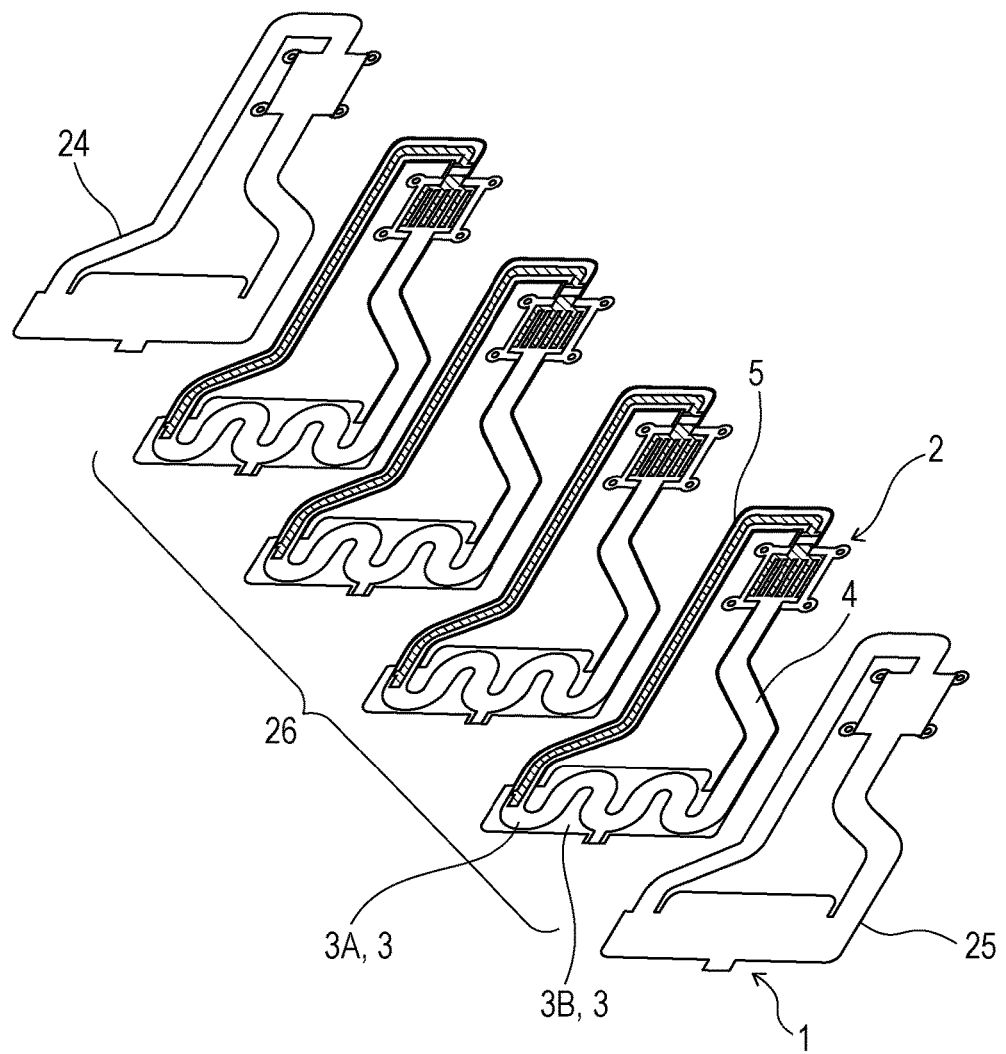
FIG. 12 is a schematic diagram illustrating the configuration of the loop heat pipe including six metallic thin plates.

As illustrated in FIG. 12, for example, six metallic thin plates, that is, two surface sheets 24 and 25 and four inner-layer sheets 26 are patterned by etching and are stacked on the top of each other, followed by diffusion bonding at once. The evaporator 2, condenser 3, vapor line 4, and liquid line 5 are thereby simultaneously formed, implementing the thin loop heat pipe 1 which may be accommodated in the mobile device 6. In this case, the metallic thin plates 24 to 26 may be copper thin plates with a thickness of about 0.1 mm.

Figure 13:
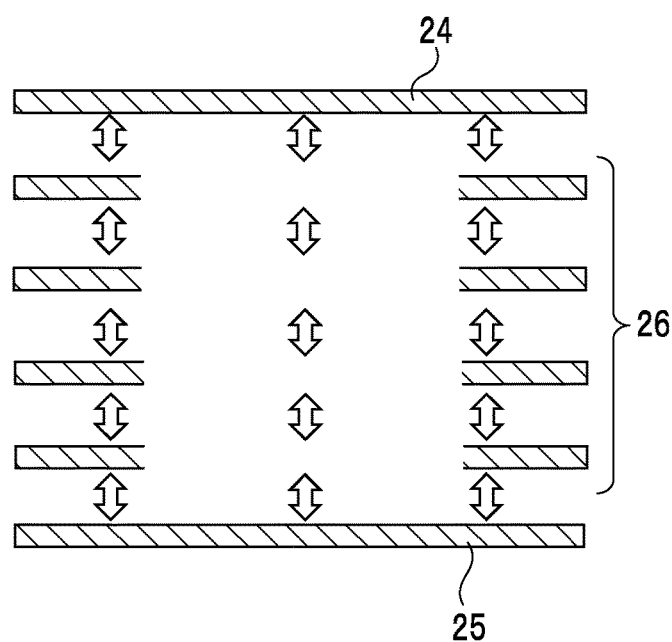
FIG. 13 is a schematic diagram for explaining the configuration of channels of a vapor line, a liquid line, and a condensation line of a condenser which are included in the loop heat pipe including six metallic thin plates.

As illustrated in FIG. 13, the four inner-layer sheets 26 include openings formed by etching. The four inner-layer sheets 26 including the openings are sandwiched by the two surface sheets 24 and 25 vertically. The space formed by the openings of the four inner-layer sheets 26 are closed at the top and bottom to form channels of the vapor line 4, the liquid line 5, and the condensation line 3A of the condenser 3.

The wick that is provided within the evaporator 2 and generates capillary force to drive fluid may be formed by providing plural micropores in the four inner-layer sheets 26 by etching. To implement the thin loop heat pipe 1, furthermore, the evaporator 2, condenser 3, vapor line 4, and liquid line 5 could be produced by bonding two metallic thin plates.

Figure 14:
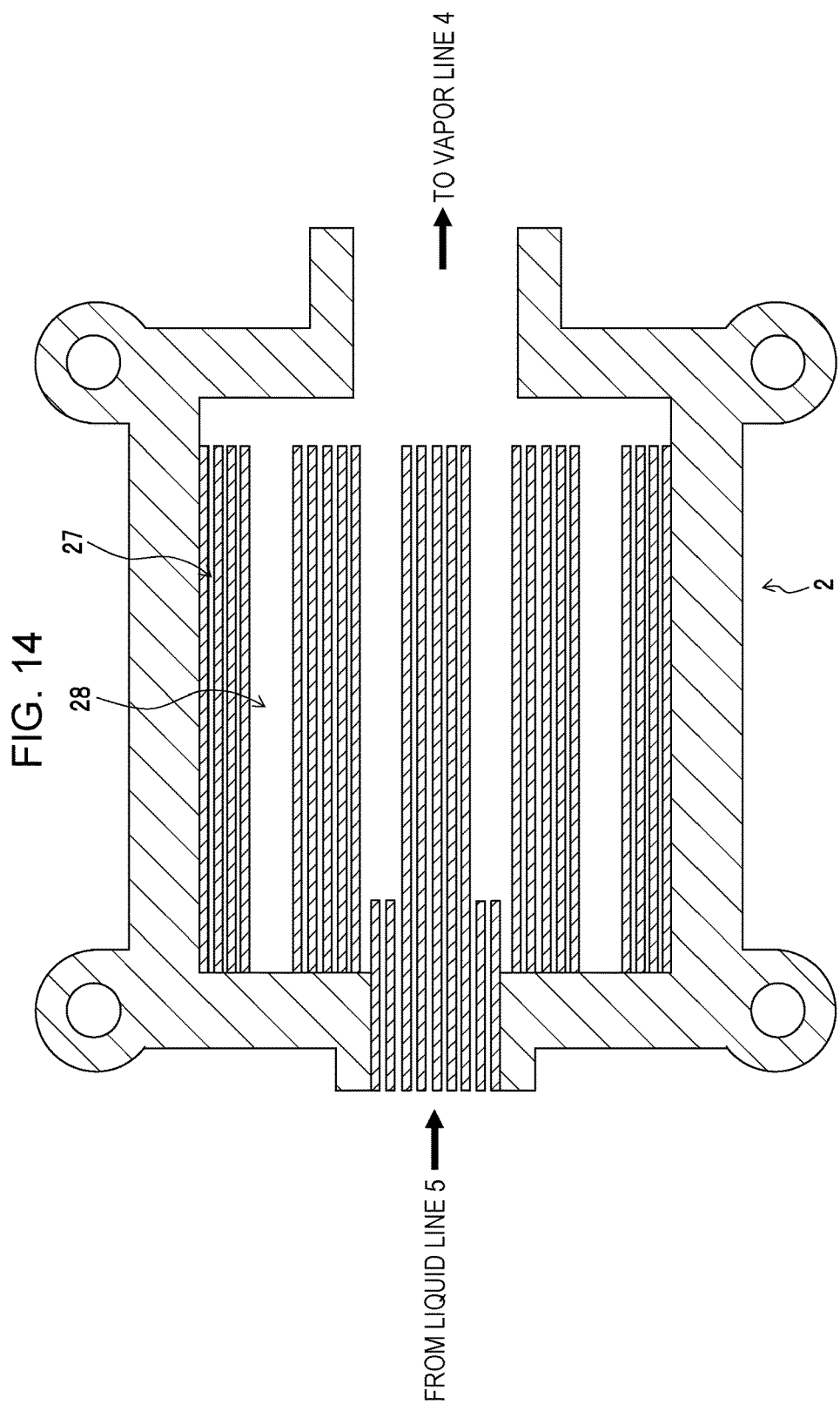
FIG. 14 is a schematic diagram for explaining the configuration of the evaporator of a loop heat pipe including two metallic thin plates, the evaporator including a comb section including only grooves extending in the length direction.

In this case, the two metallic thin plates are half-etched. Specifically, the two metallic thin plates may be patterned to form recesses and grooves having a depth smaller than the plate thickness. The patterned metallic thin plates are then bonded to form channels. In this case, in order to generate capillary force in the region constituting the evaporator 2, microgrooves 27 and wide grooves 28 could be formed by etching (half-etching, for example) as illustrated in FIG. 14, for example.

Generally, when it is assumed that the working fluid penetrates into a porous body (wick) including uniform pores, capillary pressure $\Delta P_{cap}$ generated in the evaporator 2 is expressed by the following expression (2).

$$\Delta P_{cap} = \frac{2\sigma}{r_{wick}} \cos\theta \qquad (2)$$

Herein, $r_{wick}$ is the pore radius of the porous body; σ, the surface tension of the working fluid; and θ, contact angle between the material of the porous body and the working fluid. The aforementioned expression (2) illustrates that one of the conditions to increase the capillary force is to reduce the pore radius $r_{wick}$ of the porous material. In the loop heat pipe 1 including the two metallic thin plates as described above, the pore radius $r_{wick}$ of the aforementioned expression (2) corresponds to the size (width, for example) of microgrooves formed by etching in the evaporator part and correlates with the sectional area of microchannels formed by the grooves.

To increase the capillary force, it is preferable that the size of the microgrooves is minimized so as to minimize the sectional area of the microchannels. In the case of forming microgrooves in a metallic thin plate by etching, for example, it is difficult to form microgrooves that may produce large capillary force because of the dimension precision of the openings formed with the resist material and the limitation of the etching rate, for example.

In the thin loop heat pipe 1 including the two plate members, the evaporator 2 is configured as described above in order to increase the capillary force generated in the evaporator 2. This increases the capillary force produced in the evaporator 2 in the loop heat pipe 1 which is provided at low cost and includes the two plate members 8 and 9 that allow for reduction in thickness. As described above, the loop heat pipe 1 which includes the two plate members, including the first and second plate members 8 and 9, is manufactured in the following manner.

First, the first plate member 8 is processed (half-etched, for example) to form in the region to be the evaporator 2, the first protrusions 10 extending in the length direction, from the end connected to the liquid line 5 toward the end connected to the vapor line 4, the plural second protrusions 11 extending in the width direction, that intersects with the length direction, and the plural first recesses 12 partitioned by the first and second protrusions 10 and 11 (see FIGS. 1A, 4A, and 5A, for example).

The second plate member 9 is processed (half-etched, for example) to form in the region to be the evaporator 2, either or both of the plural third protrusions 14 extending in the length direction and the plural fourth protrusions 15 extending in the width direction and the plural second recesses 16 partitioned by either or both of the third and fourth protrusions 14 and 15 (see FIGS. 1B, 3A, 3B, 4B, 5B, and 6A, for example).

The first and second plate members 8 and 9 are bonded so that in the region to be the evaporator 2, the first recesses 12 face either or both of the third and fourth protrusions 14 and 15 and each communicate with the second recesses 16 on the both sides of at least one of the corresponding third and fourth protrusions 14 and 15. The loop heat pipe 1 is thus manufactured (see FIGS. 2A, 4C, 5C, and 6B, for example).

Specifically, the thin loop heat pipe 1 may be formed in the following manner. In the region to be the evaporator 2, of one of the two metallic thin plates (two surface sheets) as the first and second plate members 8 and 9, the first recesses 12, which are partitioned by the first and second protrusions 10 and 11, and wide grooves to be the comb-like vapor channel 18 are provided by processing, such as half-etching, for example, so as to have a depth smaller than the plate thickness. In the region to be the evaporator 2, of the other metallic thin plate, the second recesses 16, which are partitioned by the third and fourth protrusions 14 and 15, and wide grooves to be the comb-like vapor channel 18 are provided by processing, such as half-etching, for example, so as to have a depth smaller than the plate thickness. In addition, the region to be the vapor line 4, the region constituting the condensation line 3A of the condenser 3, and the region to be the liquid line 5 in each of the two metallic thin plates, recesses to be the channels of the vapor line 4, the condensation line 3A of the condenser 3, and the liquid line 5 are provided, respectively. These two metallic thin plates are faced each other so that the surfaces thereof provided with the grooves and recesses are in contact with each other, followed by diffusion bonding.

The recesses provided in the regions to be the condensation line 3A of the first and second plate members 8 and 9 meander so as to increase the efficiency of heat exchange between the working fluid and outside air for sufficient condensation and liquefaction of the working fluid. Herein, in the process of patterning for shapes of the evaporator 2, vapor line 4, condenser 3, and liquid line 5, regions of the plate members around the regions to be the condensation line 3A of the condenser 3 are left flat. These regions thereby function as the heat diffusion plate 3B of the condenser 3.

In the aforementioned loop heat pipe 1, the vapor line 4, condensation line 3A, and liquid line 5 are not provided with grooves. The loop heat pipe 1 is not limited to such a configuration. For example, the liquid line 5 may be provided with the same structure as the grid pattern structure 13 or 17 (see FIGS. 1A to 4C, for example), which are provided for the aforementioned evaporator 2. Specifically, in the region constituting the liquid line 5, of the first plate member 8, plural first liquid-line protrusions extending in the length direction, plural second liquid-line protrusions extending in the width direction, and plural first liquid-line recesses partitioned by the first and second liquid-line protrusions are provided. In the region constituting the liquid line 5, of the second plate member 9, either or both of plural third liquid-line protrusions extending in the length direction and plural fourth liquid-line protrusions extending in the width direction and plural second liquid-line recesses partitioned by either or both of the third and fourth liquid-line protrusions are provided. In the region constituting the liquid line 5, the first and second plate members 8 and 9 may be bonded so that the first liquid-line recesses face either or both of the third and fourth liquid-line protrusions and each communicate with the second liquid-line recesses on both sides of at least one of the corresponding third and fourth liquid-line protrusions.

In this case, in the process of processing the first plate member 8 in the aforementioned method of manufacturing a loop heat pipe, the plural first liquid-line protrusions extending in the length direction, the plural second liquid-line protrusions in the width direction, and the plural first liquid-line recesses partitioned by the first and second liquid-line protrusions are formed in the region to be the liquid line 5, of the first plate member 8. In the process of processing the second plate member 9, either or both of the plural third liquid-line protrusions extending in the length direction and plural fourth liquid-line protrusions extending in the width direction and the plural second liquid-line recesses partitioned by either or both of the third and fourth liquid-line protrusions are formed in the region to be the liquid line 5, of the second plate member 9. In the process of bonding the first and second plate members 8 and 9, the first and second plate members 8 and 9 are bonded so that in the region to be the liquid line 5, the first liquid-line recesses face either or both of the third and fourth liquid-line protrusions and each communicate with the second liquid-line recesses on both sides of at least one of the corresponding third and fourth liquid-line protrusions.

Figure 15:
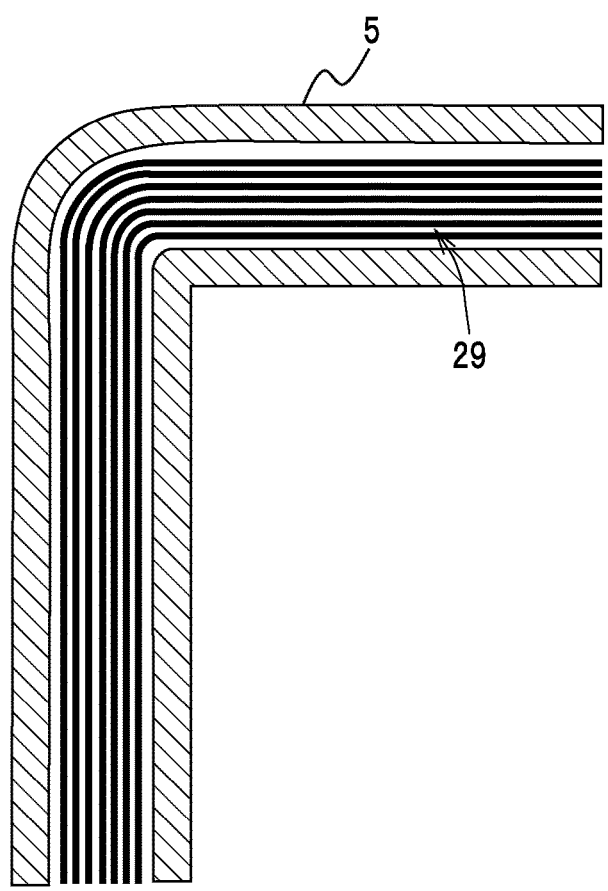
FIG. 15 is a schematic diagram illustrating a configuration example of a liquid line of the loop heat pipe according to the embodiment.

As illustrated in FIG. 15, for example, the liquid line 5 may be configured to include liquid-line grooves 29 that may generate capillary force. FIG. 15 illustrates the liquid-line grooves 29 extending in the length direction of the liquid line 5. As the liquid-line grooves 29, the liquid line 5 may include liquid-line grooves that extend in the length direction of the liquid line 5 and may generate capillary force, for example.

In this case, the liquid-line grooves (first liquid-line grooves) 29 that extend in the length direction of the region constituting the liquid line 5 and may generate capillary force are provided in the region constituting the liquid line 5, of the first plate member 8. The liquid-line grooves (second liquid-line grooves) 29 that extend in the length direction of the region to be the liquid line 5 and may generate capillary force are provided in the region constituting the liquid line 5, of the second plate member 9. The first and second plate members 8 and 9 are bonded so that the side including the first liquid-line grooves 29 and the side including the second liquid-line grooves 29 face each other in the region constituting the liquid line 5. In this case, the first liquid-line groove 29 and second liquid-line groove 29 face each other and extend in the same direction.

In the process (half-etching, for example) of processing the first plate member 8 in the aforementioned method of manufacturing a loop heat pipe, the region to be the liquid line 5, of the first plate member 8 is processed to form the first liquid-line grooves 29 that extend in the length direction of the region to be the liquid line 5 and may generate capillary force. In the process of processing the second plate member 9, the region to be the liquid line 5, of the second plate member 9 is processed to form the second liquid-line grooves 29 that extend in the length direction of the region to be the liquid line 5 and may generate capillary force. In the process of bonding the first and second plate members 8 and 9, the first and second plate members 8 and 9 are bonded so that the side including the first liquid-line grooves 29 and the side including the second liquid-line grooves 29 face each other in the region to be the liquid line 5.

Furthermore, the liquid line 5 may include as the liquid-line grooves 29: liquid-line grooves (first liquid-line grooves) that extend in the length direction of the liquid line 5 and may generate capillary force; and liquid-line grooves (second liquid-line grooves) that extend in the wide direction of the liquid line 5 and may generate capillary force. In this case, the first liquid-line grooves 29 that extend in the length direction of the region constituting the liquid line 5 and may generate capillary force are provided in the region constituting the liquid line 5, of the first plate member 8. The second liquid-line grooves 29 that extend in the width direction of the region constituting the liquid line 5 and may generate capillary force are provided in the region constituting the liquid line 5, of the second plate member 9. The first and second plate members 8 and 9 are bonded so that the side including the first liquid-line grooves 29 and the side including the second liquid-line grooves 29 face each other in the region constituting the liquid line 5. In this case, the first liquid-line grooves 29 and second liquid-line groove 29 face each other and intersect with each other at a certain angle (at right angles, for example).

In the process (half-etching, for example) of processing the first plate member 8 in the aforementioned method of manufacturing a loop heat pipe, the region to be the liquid line 5, of the first plate member 8 is processed to form the first liquid-line grooves 29 that extend in the length direction of the region to be the liquid line 5 and may generate capillary force. In the process to process the second plate member 9, the region to be the liquid line 5, of the second plate member 9 is processed to form the second liquid-line grooves 29 that extend in the width direction of the region to be the liquid line 5 and may generate capillary force. In the process to bond the first and second plate members 8 and 9, the first and second plate members 8 and 9 are bonded so that the side including the first liquid-line grooves 29 and the side including the second liquid-line grooves 29 face each other in the region to be the liquid line 5.

The grid pattern structures 13 and 17 and liquid-line grooves 29 may be provided across the entire liquid line 5 or in a part of the liquid line 5. The number, intervals, and shape of the grid pattern structures 13 and 17 and liquid-line grooves 29 are not limited to those illustrated herein. The liquid line 5 is also provided with the grid pattern structures 13 and 17 and the liquid-line grooves 29 that may generate capillary force because of the following reason. The mobile device stands vertically in a portrait position in some cases, and the heat generating component 7 as the heat source is located in upper side. Even in such a case, capillary force allows the working fluid of liquid phase to flow within the liquid line 5 and flow into the evaporator 2, implementing stable operation of the loop heat pipe 1.

Hereinafter, a description is given of the specific configuration example and the manufacturing method thereof. The first copper thin plate 8 with a thickness of about 0.25 mm is patterned with resist so as to have a shape illustrated in FIG. 16A, and exposed copper is then etched. Herein, the vapor line 4 and the condensation line 3A of the condenser 3 have a width of about 7 mm, and the liquid line 5 has a width of about 6 mm.

The channels of the vapor line 4, and the condensation line 3A of the condenser 3, and the liquid line 5 are formed by etching (half-etching) the copper thin plate to a depth of about 0.15 mm. As illustrated in FIG. 9, the comb section 19 and comb-like vapor channel 18 are formed in the evaporator 2. The comb section 19 is formed by etching (half-etching) to have the grid pattern 13 illustrated in FIG. 1A, for example.

Herein, the plural first and second protrusions 10 and 11 constituting the grid pattern 13 have intervals of about 0.24 mm and a depth of about 0.12 mm. The wide grooves constituting the plural branch vapor channels 18A of the comb-like vapor channel 18 have a width of about 1 mm and a depth of about 0.15 mm. In FIG. 16A, the region in which the grid pattern 13 is to be provided is indicated by a pattern.

Next, the second copper thin plate 9 with a thickness of about 3 mm is patterned with resist so as to have a shape illustrated in FIG. 16B, and exposed copper is then etched. Herein, the second copper thin plate 9 is processed so that the evaporator 2, vapor line 4, condenser 3, and liquid line 5 are positioned symmetrically to those of the product processed as illustrated in FIG. 16A. Herein, the vapor line 4 and the condensation line 3A of the condenser 3 have a width of about 7 mm, and the liquid line 5 has a width of about 6 mm.

The channels of the vapor line 4, condensation line 3A, and liquid line 5 are formed by etching the copper thin plate to a depth of about 0.15 mm. As illustrated in FIG. 9, the comb section 19 and comb-like vapor channel 18 are formed in the evaporator 2. The comb section 19 is formed by etching (half-etching) to have the grid pattern 17 illustrated in FIG. 1B, for example.

Herein, the plural third and fourth protrusions 14 and 15 constituting the grid pattern 17 have intervals of about 0.24 mm and a depth of about 0.12 mm. The wide grooves constituting the plural branch vapor channels 18A of the comb-like vapor channel 18 has a width of about 1 mm and a depth of about 0.15 mm. In FIG. 16B, the region in which the grid pattern 17 is provided is indicated by a pattern.

The first copper thin plate 8 etched as illustrated in FIG. 16A and the second copper thin plate 9 etched as illustrated in FIG. 16B are diffusion-bonded. The thus-obtained product is evacuated to a vacuum through the liquid inlet. Water (or ethanol or chlorofluorocarbon) as the working fluid is then injected into the pipe. The thin loop heat pipe 1 having a thickness of about 0.5 mm is thereby produced. The thus-produced loop heat pipe 1 may be a thin loop heat pipe with a thickness of about 0.6 mm in which the first and second copper thin plates 8 and 9 have a thickness of about 0.3 mm while the vapor line 4 and the condensation line 3A of the condenser 3 have a width of about 8 mm, for example.

In the loop heat pipe 1 produced as described above, the patterns provided for the regions to be the evaporator 2, of the first and second copper thin plates 8 and 9 may be formed by etching (half-etching) as illustrated in FIGS. 3A, 3B, 4A, 4B, 5A, 5B, and 6A, for example. In this case, the dimensions may be the same as those in the aforementioned case.

Figure 17:
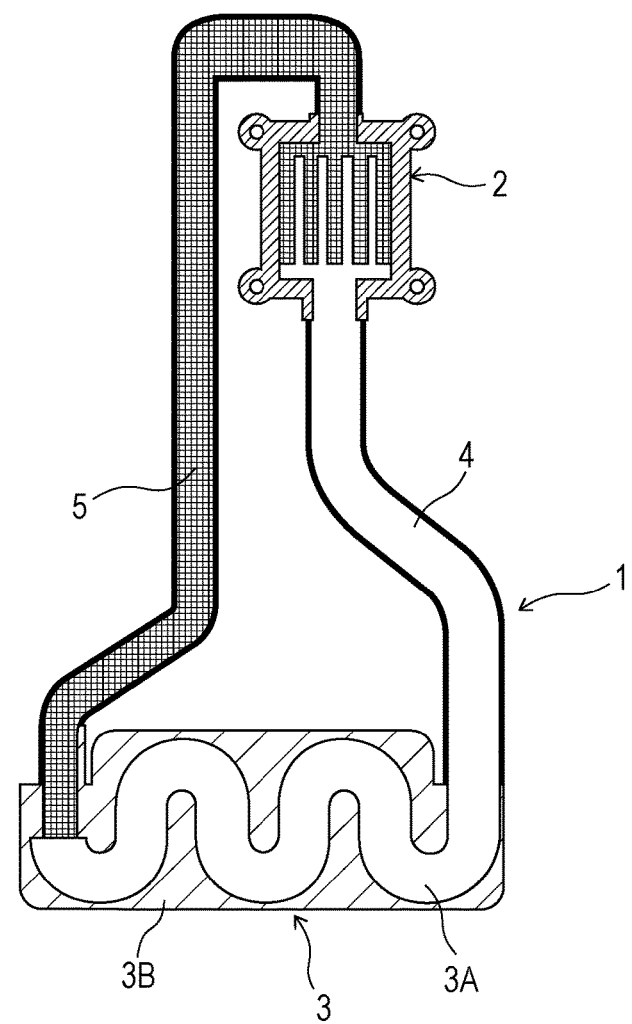
FIG. 17 is a schematic diagram illustrating a configuration example of the loop heat pipe according to the embodiment in which the liquid line is provided with grooves.

In the loop heat pipe 1 produced as described above, to form the same structure (the grid pattern structures 13 and 17) as that provided within both the liquid line 5 and evaporator 2 as illustrated in FIG. 17, the aforementioned grid patterns 13 and 17 are formed by etching (half-etching) in the regions to be the liquid line 5, of the first and second copper thin plates 8 and 9. In FIG. 17, the region in which the grid patterns 13 and 17 are provided is indicated by a pattern.

Furthermore, in the loop heat pipe 1 produced as described above, to form the liquid-line grooves 29 that may generate capillary force also within the liquid line 5 (see FIG. 15), the regions to be the liquid line 5 of the copper thin plates are etched (half-etched) to form the liquid-line grooves 29. In this case, the liquid-line grooves 29 extending in the length direction of the liquid line 5 may be formed in the regions to be the liquid line 5 of both of the first and second copper thin plates 8 and 9. Alternatively, the liquid-line grooves 29 extending in the length direction of the liquid line 5 may be formed in the region to be the liquid line 5 of one of the copper thin plate while the liquid-line grooves 29 extending in the width direction of the liquid line 5 are formed in the region to be the liquid line 5 of the other copper thin plate.

The width and depth of the liquid-line grooves 29 may be set to about 0.1 mm and about 0.12 mm, respectively. The shape and pipe arrangement of the loop heat pipe 1 are not limited to those described above. Although the metallic thin plates are copper thin plates, the material thereof is not limited to copper as long as the loop heat pipe 1 is formed by diffusion bonding of the metallic thin plates at once. The metallic thin plates may be made of stainless, an alloy material, or the like, that is suitable for patterning by etching or the like and diffusion bonding. The dimensions of the loop heat pipe 1 are not limited to those described above and may be optimized properly depending on the amount and distance of heat transfer and the height and width of the pipe that are requested.

In the loop heat pipe 1 produced as described above, the evaporator 2 includes the metallic thin plates (first and second copper thine plates 8 and 9) which are bonded with the grid patterns 13 and 17 shifted from each other. For example, the sectional area of the channels through which the fluid passes may be designed to be not more than half that of an only-groove processed evaporator (see FIG. 14). This may generate capillary force twice or more that of the only-groove processed evaporator. The only-groove processed evaporator refers to an evaporator including grooves extending in the length direction of the evaporator in each metallic thin plate (see FIG. 14). Herein, each groove width is the same as the intervals of the protrusions constituting the grid pattern structures 13 and 17 of the aforementioned embodiment.

Figure 18:
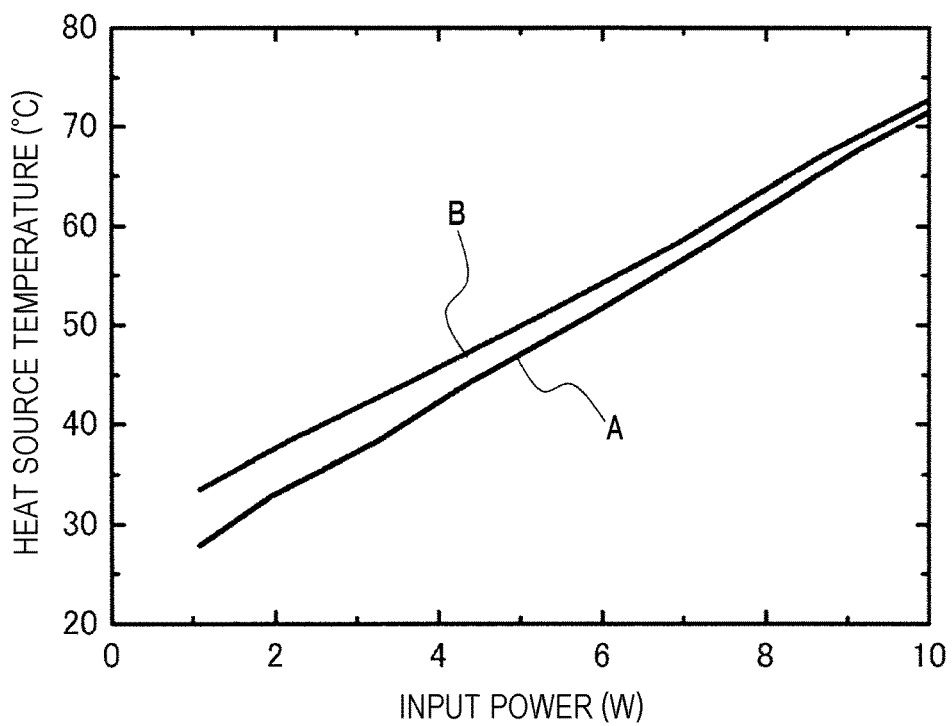
FIG. 18 is a diagram illustrating heat source temperature when heat is applied to the evaporator of the loop heat pipe of the embodiment.

FIG. 18 is a diagram illustrating the relationship between the evaporator temperature (heat source temperature) and input power (the amount of heat applied to the evaporator) in the loop heat pipe 1, that includes the evaporator 2 (see FIGS. 1A and 1B) provided with the grid pattern structures 13 and 17 as described in the above embodiment, and a loop heat pipe that includes an only-groove processed evaporator (see FIG. 14). FIG. 18 illustrates, as the evaporator temperature (heat source temperature), saturated temperature of the heat source part when the heat having entered the evaporator of the loop heat pipe transfers to the condenser. In FIG. 18, solid line A indicates the evaporator temperature (heat source temperature) in the loop heat pipe 1, that includes the evaporator 2 (see FIGS. 1A and 1B) provided with the grid pattern structures 13 and 17 as described in the embodiment. In FIG. 18, solid line B indicates the evaporator temperature (heat source temperature) in the loop heat pipe including the only-groove processed evaporator (see FIG. 14).

As illustrated in FIG. 18, in the loop heat pipe 1, which includes the evaporator 2 (see FIGS. 1A and 1B) provided with the grid pattern structures 13 and 17 as described in the embodiment, it is revealed that the improvement in capillary force of the evaporator 2 enhances the start-up performance of the loop heat pipe 1. The evaporator temperature (heat source temperature) is therefore lower than that in the loop heat pipe including the only-groove processed (see FIG. 14).

Figure 19:
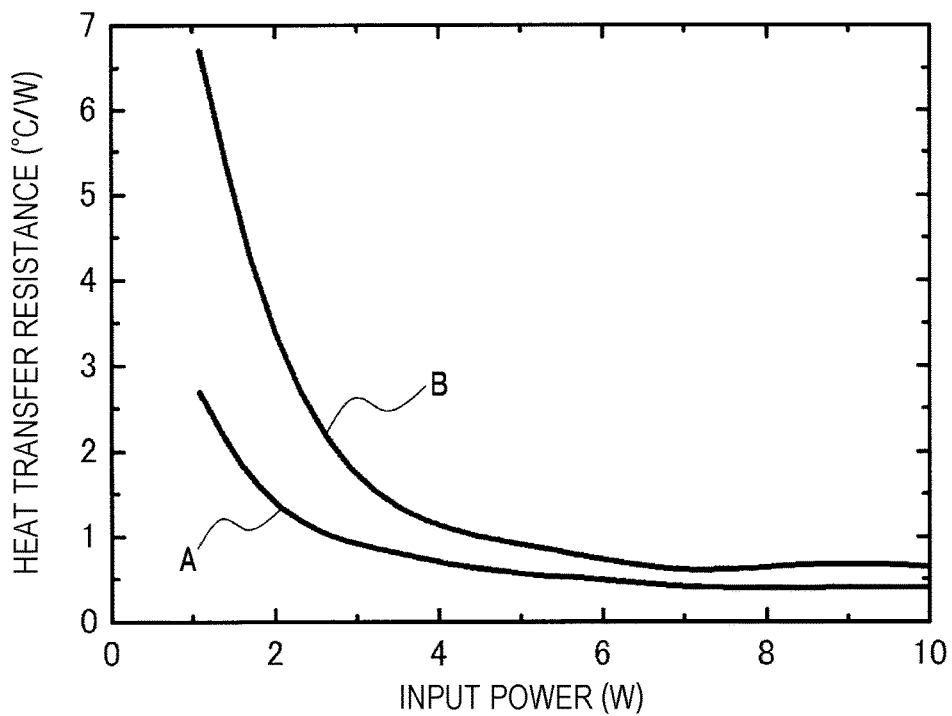
FIG. 19 is a diagram illustrating a heat transfer resistance when heat is applied to the evaporator of the loop heat pipe of the embodiment.

FIG. 19 is a diagram illustrating the relationship between the heat transfer resistance and input power (the amount of heat applied to the evaporator) in the loop heat pipe 1, that includes the evaporator 2 (see FIGS. 1A and 1B) provided with the grid pattern structures 13 and 17 as described in the embodiment, and a loop heat pipe that includes the only-groove processed evaporator (see FIG. 14). The heat transfer resistance represents the efficiency of heat transfer from the evaporator to the condenser. In FIG. 19, solid line A indicates the heat transfer resistance in the loop heat pipe 1 that includes the evaporator 2 (see FIGS. 1A and 1B) provided with the grid pattern structures 13 and 17 as described in the above embodiment. In FIG. 19, solid line B indicates the heat transfer resistance in the loop heat pipe including the only-groove processed evaporator (see FIG. 14).

As illustrated in FIG. 19, in the loop heat pipe 1 that includes the evaporator 2 (see FIGS. 1A and 1B) provided with the grid pattern structures 13 and 17 as described in the embodiment, the heat transfer resistance is small, and heat transfer is performed efficiently compared with the loop heat pipe including the only-groove processed evaporator (see FIG. 14). The loop heat pipe according to the embodiment, the manufacturing method thereof, and the electronic device provide an advantage that increases the capillary force generated in the evaporator 2 of the loop heat pipe 1 that is made thinner using the two plate members 8 and 9.

The present disclosure is not limited to configurations of the above-mentioned embodiment and modification, and may have various configurations or combination configuration as appropriate without deviating from the subject matter of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A loop heat pipe comprising:
an evaporator;
a condenser;
a first line which connects the evaporator to the condenser and in which working fluid of vapor phase flows; and
a second line which connects the condenser to the evaporator and in which working fluid of liquid phase flows,
wherein
the evaporator, the condenser, the first line, and the second line constitute a structure by bonding a first plate and a second plate,
the first plate includes in a region for the evaporator:
a plurality of first protrusions that extend in a length direction of the evaporator from an end side connected to the second line toward an end side connected to the first line;
a plurality of second protrusions that extend in a width direction of the evaporator, which intersects with the length direction; and
a plurality of first recesses which are partitioned by the plurality of first protrusions and the plurality of second protrusions,
the second plate includes in a region for the evaporator:
either or both of a plurality of third protrusions extending in the length direction and a plurality of fourth protrusions extending in the width direction; and
a plurality of second recesses partitioned by either or both of the plurality of third protrusions and the plurality of fourth protrusions, the first plate and the second plate are bonded to each other so that in the region, the plurality of first recesses face either or both of the plurality of third protrusions and the plurality of fourth protrusions while each of the plurality of first recesses communicates with the second recesses located on both sides of a corresponding third or fourth protrusion or any combination thereof.

2. The loop heat pipe according to claim 1, wherein
the plurality of first protrusions extend parallel to each other,
the plurality of second protrusions extend parallel to each other and are orthogonal to the plurality of first protrusions,
when the second plate includes the plurality of third protrusions, the plurality of third protrusions extend parallel to each other and parallel to the plurality of first protrusions, and
when the second plate includes the plurality of fourth protrusions, the plurality of fourth protrusions extend parallel to each other and parallel to the plurality of second protrusions.

3. The loop heat pipe according to claim 1, wherein
the plurality of first protrusions extend parallel to each other,
the plurality of second protrusions extend parallel to each other and diagonally intersect with the plurality of first protrusions,
when the second plate includes the plurality of third protrusions, the plurality of third protrusions extend parallel to each other and are parallel to the plurality of first protrusions, and
when the second plate includes the plurality of fourth protrusions, the plurality of fourth protrusions extend parallel to each other and extend parallel to the plurality of second protrusions.

4. The loop heat pipe according to claim 1, wherein
intervals of the plurality of first protrusions, intervals of the plurality of second protrusions, and intervals of either or both of the plurality of third protrusions and the plurality of fourth protrusions are a same.

5. The loop heat pipe according to claim 1, wherein
the second plate includes the plurality of third protrusions, the plurality of fourth protrusions, and the plurality of second recesses partitioned by the plurality of third protrusions and the plurality of fourth protrusions, and
the plurality of first recesses and the plurality of second recesses have a same size.

6. The loop heat pipe according to claim 1, wherein
in the first plate, the first protrusion and the second protrusion that constitute a side surface of each of the plurality of first recesses are made of a same material as that of the bottom surface of the first recess, and
in the second plate, at least one of the third and fourth protrusions that constitute a side surface of each of the plurality of second recesses is made of the same material as that of the bottom surface of the second recess.

7. The loop heat pipe according to claim 1, wherein
portions of the first and second protrusions constituting the side surface of each of the plurality of first recesses include first communicating grooves configured to allow adjacent first recesses to communicate with each other.

8. The loop heat pipe according to claim 7, wherein
the second plate includes the plurality of third protrusions, the plurality of fourth protrusions, and the plurality of second recesses partitioned by the plurality of third protrusions and the plurality of fourth protrusions, and
the third and fourth protrusions constituting the side surface of each of the plurality of second recesses include second communicating grooves configured to allow adjacent second recesses to communicate with each other.

9. The loop heat pipe according to claim 1, wherein
the evaporator includes:
a comb-shaped evaporator which extends from an end connected to the liquid line and divides to a plurality of branch portions and in which the working fluid of liquid phase penetrates and becomes vapor phase; and
a comb-like vapor channel which is provided facing the comb-shaped evaporator, extends from an end connected to the first line, and divides into a plurality of branch vapor channels and in which the working fluid of vapor phase flows,
the first plate includes the plurality of first protrusions, the plurality of second protrusions, and the plurality of first recesses in a region constituting the comb-shaped evaporator, and
the second plate includes either or both of the plurality of third protrusions and the plurality of fourth protrusions and the plurality of second recesses in the region constituting the comb-shaped evaporator.

10. The loop heat pipe according to claim 9, wherein
in the comb-like vapor channel, a channel width of each of the plurality of branch vapor channels is greater than the intervals of the plurality of first protrusions.

11. The loop heat pipe according to claim 9, wherein
each of the plurality of branch portions of the comb-shaped evaporator includes a third communicating groove that allows adjacent two branch vapor channels of the plurality of branch vapor channels of the comb vapor channel to communicate with each other.

12. The loop heat pipe according to claim 11, wherein
the third communicating groove is provided for at least one of the first or second plates or any combination thereof.

13. The loop heat pipe according to claim 1, wherein
the first plate includes, in a region constituting the liquid line, a plurality of first liquid-line protrusions extending in the length direction, a plurality of second liquid-line protrusions extending in the width direction, and a plurality of first liquid-line recesses partitioned by the plurality of first liquid-line protrusions and the plurality of second liquid-line protrusions,
the second plate includes, in the region constituting the liquid line, either or both of a plurality of third liquid-line protrusions extending in the length direction and a plurality of fourth liquid-line protrusions extending in the width direction and a plurality of second liquid-line recesses partitioned by either or both of the plurality of third liquid-line protrusions and the plurality of fourth liquid-line protrusions, and
the first and second plates are bonded so that in the region constituting the liquid line, the plurality of first liquid-line recesses face either or both of the plurality of third liquid-line protrusions and the plurality of fourth liquid-line protrusions while each of the plurality of first liquid-line recesses communicates with the second liquid-line recesses on both sides of at least one of the corresponding third and fourth liquid-line protrusions.

14. The loop heat pipe according to claim 1, wherein
the liquid line includes a liquid-line groove that is able to generate capillary force.

15. The loop heat pipe according to claim 1, wherein
the first plate includes in a region constituting the liquid line, a first liquid-line groove that extends in a length direction of the region constituting the liquid line and is able to generate capillary force,
the second plate includes in the region constituting the liquid line, a second liquid-line groove that extends in the length direction of the region constituting the liquid line and is able to generate capillary force, and
the first and second plates are bonded with a side including the first liquid-line groove and a side including the second liquid-line groove facing each other in the region constituting the liquid line.

16. The loop heat pipe according to claim 1, wherein
the first plate includes in a region constituting the liquid line, a first liquid-line groove that extends in a length direction of the region constituting the liquid line and is able to generate capillary force,
the second plate includes in the region constituting the liquid line, a second liquid-line groove that extends in a width direction of the region constituting the liquid line and is able to generate capillary force, and
the first and second plates are bonded with the side including the first liquid-line groove and the side including the second liquid-line groove facing each other in the region constituting the liquid line.

17. An electronic device, comprising:
a heat generating component; and
a loop heat pipe for cooling the heat generating component, wherein the loop heat pipe includes:
an evaporator;
a condenser;
a first line which connects the evaporator to the condenser and in which working fluid of vapor phase flows; and
a second line which connects the condenser to the evaporator and in which working fluid of liquid phase flows, wherein
the evaporator, the condenser, the first line, and the second line constitute a structure by bonding a first plate and a second plate, respectively,
the first plate includes in a region for the evaporator:
a plurality of first protrusions that extend in a length direction of the evaporator from an end side connected to the second line toward an end side connected to the first line;
a plurality of second protrusions that extend in a width direction of the evaporator, which intersects with the length direction; and
a plurality of first recesses which are partitioned by the plurality of first protrusions and the plurality of second protrusions,
the second plate includes in the region for the evaporator:
either or both of a plurality of third protrusions extending in the length direction and a plurality of fourth protrusions extending in the width direction; and
a plurality of second recesses partitioned by either or both of the plurality of third protrusions and the plurality of fourth protrusions,
the first plate and the second plate are bonded to each other so that in the region, the plurality of first recesses face either or both of the plurality of third protrusions and the plurality of fourth protrusions while each of the plurality of first recesses communicates with the second recesses located on both sides of a corresponding third or fourth protrusion or any combination thereof.

18. A method of manufacturing a loop heat pipe, comprising:
processing a first plate to form, in a region to be an evaporator, a plurality of first protrusions that extend in a length direction from an end side connected to a liquid line toward an end side connected to the first line, a plurality of second protrusions that extend in a width direction, which intersects with the length direction; and a plurality of first recesses which are partitioned by the plurality of first protrusions and the plurality of second protrusions;
processing a second plate to form, in the region to be the evaporator, either or both of a plurality of third protrusions extending in the length direction and a plurality of fourth protrusions extending in the width direction; and a plurality of second recesses partitioned by either or both of the plurality of third protrusions and the plurality of fourth protrusions; and
bonding the first plate and the second plate to each other so that in the region to be the evaporator, the plurality of first recesses face either or both of the plurality of third protrusions and the plurality of fourth protrusions while each of the plurality of first recesses communicates with the second recesses located on both sides of at least one of the corresponding third and fourth protrusions.

19. The method of manufacturing a loop heat pipe according to claim 18, wherein
in the processing the first plate, a plurality of first liquid-line protrusions that extend in the length direction, a plurality of second liquid-line protrusions that extend in a width direction, and a plurality of first liquid-line recesses which are partitioned by the plurality of first liquid-line protrusions and the plurality of second liquid-line protrusions are formed in a region to be the liquid line, of the first plate,
in the processing the second plate, either or both of a plurality of third liquid-line protrusions extending in the length direction and a plurality of fourth liquid-line protrusions extending in the width direction and a plurality of second liquid-line recesses partitioned by either or both of the plurality of third liquid-line protrusions and the plurality of fourth liquid-line protrusions are formed in a region to be the liquid line, of the second plate, and
in the bonding the first plate and the second plate, in the region to be the liquid line, the first and second plates are bonded so that the plurality of first liquid-line recesses face either or both of the plurality of third liquid-line protrusions and the plurality of fourth liquid-line protrusions while each of the plurality of first liquid-line recesses communicates with the second liquid-line recesses on both sides of at least one of the corresponding third and fourth liquid-line protrusions.

* * * * *